(12) United States Patent
Bernstein et al.

(10) Patent No.: US 6,452,251 B1
(45) Date of Patent: Sep. 17, 2002

(54) DAMASCENE METAL CAPACITOR

(75) Inventors: Kerry Bernstein, Underhill, VT (US); Robert M. Geffken, Burlington, VT (US); Anthony K. Stamper, Williston, VT (US); Stephen A. St. Onge, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/540,737

(22) Filed: Mar. 31, 2000

(51) Int. Cl.[7] .............................................. H01L 29/00
(52) U.S. Cl. ....................... 257/532; 257/301; 257/306; 257/310; 257/774
(58) Field of Search ................................ 257/301, 306, 257/310, 532, 774

(56) References Cited

U.S. PATENT DOCUMENTS

| | | | | |
|---|---|---|---|---|
| 4,481,283 A | | 11/1984 | Kerr et al. .................... 430/319 |
| 5,471,418 A | | 11/1995 | Tanigawa .................... 365/149 |
| 5,604,145 A | | 2/1997 | Hashizime et al. ........... 437/52 |
| 5,606,189 A | | 2/1997 | Adan .......................... 257/303 |
| 5,648,290 A | * | 7/1997 | Yee .............................. 437/52 |
| 5,696,394 A | | 12/1997 | Jones, Jr. et al. ........... 257/295 |
| 5,708,559 A | * | 1/1998 | Barbazon et al. ........... 361/313 |
| 5,753,527 A | | 5/1998 | Itoh et al. ..................... 437/52 |
| 5,792,687 A | | 8/1998 | Jeng et al. .................. 438/253 |
| 5,811,868 A | | 9/1998 | Bertin et al. ................ 257/516 |
| 5,812,364 A | | 9/1998 | Oku et al. ................... 361/312 |
| 5,874,778 A | | 2/1999 | Bhattacharyya et al. ..... 257/758 |
| 6,057,571 A | * | 5/2000 | Miller et al. ................ 257/296 |
| 6,249,016 B1 | * | 6/2001 | Chaudhry et al. .......... 257/296 |
| 6,251,740 B1 | * | 6/2001 | Johnson et al. ............. 438/381 |
| 6,329,234 B1 | * | 12/2001 | Ma et al. .................... 438/210 |
| 6,346,454 B1 | * | 2/2002 | Sung et al. .................. 438/396 |
| 6,222,219 B1 | * | 4/2002 | Gambino et al. ............. 257/94 |

FOREIGN PATENT DOCUMENTS

| JP | 6-53412 | * | 2/1994 |
| JP | 10-261772 | * | 9/1998 |

* cited by examiner

Primary Examiner—Nathan J. Flynn
Assistant Examiner—Ahmad N. Sefer
(74) Attorney, Agent, or Firm—Downs Rachlin Martin PLLC

(57) ABSTRACT

A capacitor (60 and 126) fabricated on a semiconductor chip which has a strap contact (41A, 119A) which interconnects the bottom plate (41B, 111A) of the capacitor into the chip circuitry. In one version, an extension of the material making up the bottom plate of the capacitor forms the strap contact. In another version, the capacitor (185) includes a folding of the bottom plate, dielectric layer and top plate to utilize available space and thus increase its capacitance. Several manufacturing methods allow for integration of fabrication of the various versions of the capacitor into a standard dual or single damascene manufacturing process, including a copper damascene process.

22 Claims, 24 Drawing Sheets

DAMASCENE METAL CAPACITOR

FIELD OF INVENTION

The present invention relates to fabrication of a capacitor in the layers of metalization on a semiconductor chip and, more specifically, to a metal capacitor made as part of a copper dual damascene fabrication process which includes forming a structure for interconnecting the capacitor into adjacent circuitry on the semiconductor wafer and to a metal capacitor that has a folded configuration.

BACKGROUND OF THE INVENTION

As front end of the line (FEOL) components of a chip have become progressively smaller, more numerous, more complex and faster, the number of back end of the line (BEOL) layers has increased. Because of the size and density of the FEOL devices, the width, and hence, the cross sectional areas, of the interconnect lines in the BEOL layers has been reduced. However, reducing such cross sectional area raises the resistance of the aluminum lines heretofore used. Thus, recently there has been a movement to using copper in the BEOL process because of its low resistance qualities. Use of copper has required the adoption of a whole new fabrication technology based on copper dual damascene manufacturing techniques. With these developments has come the related desire to include passive circuit elements, e.g., decoupling capacitors, formerly placed in the packaging of a semiconductor chip right on the chip to take advantage of the new opportunities for increased speed that copper offers.

Fabrication of capacitors in the context of new dual damascene metal fabrication processes creates certain challenges. Providing capacitors having a desired capacitance in the space or "footprint" available can be problematic. Also, to avoid unacceptable variation in capacitance due to variation in via depth, width, and slope of the materials used to make the capacitor in a known dual damascene fabrication process, adequate control of reactive ion etch (RIE) selectivity is a challenge and related process control issues are created.

SUMMARY OF THE INVENTION

It is another objective of the present invention to provide a method of fabricating a metal capacitor on a chip as part of a copper dual or single damascene manufacturing process.

It is yet another objective to provide a method of fabricating a precision metal capacitor on a semiconductor chip as part of a copper dual or single damascene manufacturing process.

It is still another objective of the present invention to provide a capacitor with a unique strap contact for the bottom plate of the capacitor.

It is still a further objective of the present invention to provide a capacitor structure that maximizes use of available space on a semiconductor wafer to thereby increase its capacitance.

The present invention accomplishes these and other objectives by providing a contact for the bottom plate of a capacitor fabricated on a semiconductor wafer with an interconnect line adjacent, but spaced from, the bottom plate and a strap contact that connects the bottom plate to the interconnect line.

Another aspect of the present invention is a capacitor structure in a semiconductor device. The structure comprises an insulating layer having a trench and at least two vias formed in the trench. A bottom plate lines the trench and the at least two vias. A dielectric layer is positioned above the bottom plate and a top plate is positioned above the dielectric layer.

Yet another aspect of the present invention is a method of forming a capacitor on a wafer having devices fabricated up through a metal interconnect level and having an insulator level with at least one via and trench formed therein. The method comprises the steps of: (a) depositing a first barrier layer; (b) depositing a dielectric material on the barrier layer; (c) depositing a second barrier layer on the dielectric material; and (d) depositing a metal conductor on the second barrier layer.

Still another aspect of the present invention is a method of forming a capacitor on a wafer having devices fabricated up through a metal interconnect level having an interconnect and a surface. The method comprises the steps of: (a) depositing an insulator on the metal interconnect level, the insulator having a top surface; (b) forming in the insulator a via that intersects the interconnect and a trench adjacent the via; (c) depositing a barrier layer in the via and in the trench; (d) depositing a dielectric material above the barrier layer; and (e) depositing a metal conductor above the dielectric material.

BRIEF DESCRIPTION OF THE DRAWINGS

FIG. 1K' is similar to FIG. 1K, except that it illustrates a slight variation on the method shown in FIGS. 1A–1K;

FIGS. 2B'–2G' are identical to FIGS. 2B–2G, except that a larger opening is formed in FIG. 2B than in FIG. 2B';

FIG. 3E' is similar to FIG. 3E, except that only a single barrier layer is provided in the non-capacitor via.

DETAILED DESCRIPTION OF THE INVENTION

The present invention is a capacitor fabricated during a back end of the line (BEOL) dual damascene fabrication process. One version of the capacitor structure has a unique strap contact used to connect the bottom plate of the capacitor into the surrounding circuitry. A second version has a folded configuration to increase the size of the capacitor which thereby maximizes use of available space to increase capacitance.

Figure 1A:
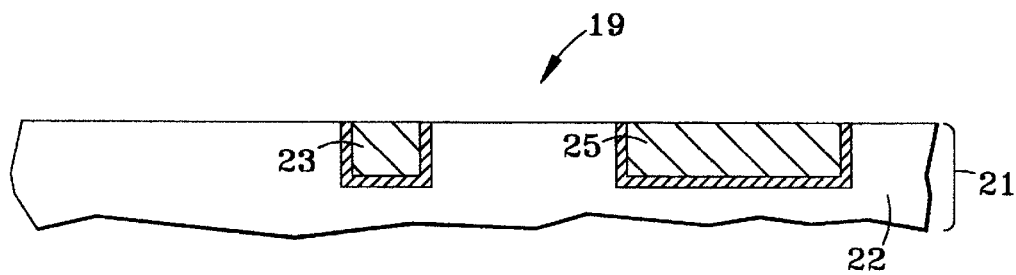
FIGS. 1A–1K are schematic, cross-sectional views of the steps of one embodiment of the method of fabricating a capacitor in a semiconductor device.
Figure 1B:
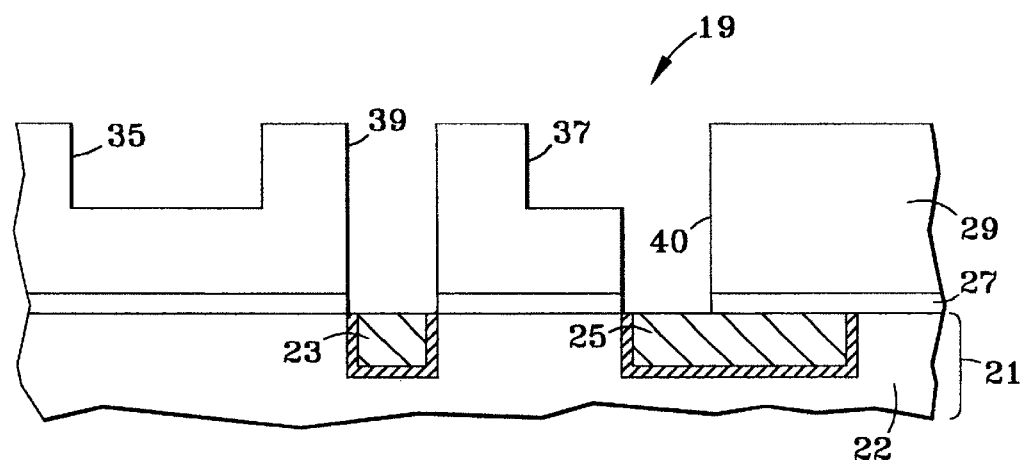

FIGS. 1A–1K illustrate one embodiment for manufacturing the first version of the invention. FIG. 1A depicts the prior fabrication in chip 19 through metal interconnect level 21. The latter includes an insulator 22 in which metal interconnects 23 and 25 are embedded. For purposes of illustration but not limitation, interconnects 23 and 25 are shown as made from copper. Alternatively, transistors, diffusions, passive devices, local interconnects, contacts, or the like, as known in the art, could be fabricated in level 21. FIG. 1B shows the formation of planar dielectric layer 27 on metal interconnect level 21. Preferably, layer 27 is made from a nitride, e.g., $SiN_xH_y$, or carbide, $SiC_xH_y$, deposited to a thickness of about 10 to 50 nm, which acts as a copper diffusion barrier. If interconnects 23 and 25 contain copper or any other element, the diffusion of which into insulating layer 29 (discussed below) needs to prevented, then layer 27 is required. If interconnects in layer 21, e.g., 23 and 25, are not comprised of copper or other metals whose diffusion into dielectric layer 29 need to be prevented, then layer 27 is optional.

An insulating layer 29 is then formed on top of planar dielectric layer 27. Insulating layer 29 is preferably made from one or more of $SiO_2$, fluorinated $SiO_2$ (FSG), polyarylene ether (PAE), aerogels, hydrogen silsesquoixane (HSQ), methyl silsesquoixane (MSQ) and $SiO_xC_yH_z$, or other similar materials having a low relative dielectric constant K, e.g., in the range of 2–5. In the next step, a standard photo-patterning and etching process is conducted to define capacitor trench 35 in insulating layer 29, and wire opening 37 and wire/via 39 and via 40 in dielectric layer 27 and insulating layer 29. This is typically a two step process, with trench 35 and opening 37 being etched partially into insulator layer 29 during one mask/etch/strip step, and then vias 39 and 40 being completely through insulator layers 29 and 27. A reactive ion etch (RIE) is typically used for these etch processes. The order of the steps is not critical. Since the technique of depositing a photoresist, photo patterning with a mask, developing the photoresist, etching and removing the excess photoresist is basic and well known to those skilled in the art, a complete rendition of the entire process will not be given each time the process is discussed. Rather terms such as "photo-patterning," "etching," "mask/etch/strip" or similar familiar terminology will be used to indicate the process. Similarly, some of the Figures do not include all of the layers used for this process, but those familiar with the art will readily understand where they occur.

Figure 1C:
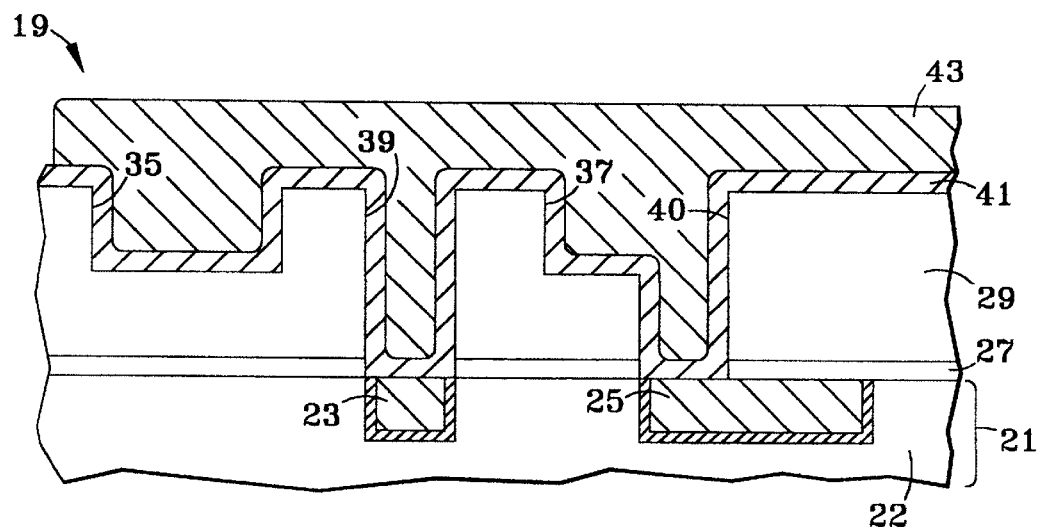

Next, as illustrated in FIG. 1C, a conductive barrier layer 41 is deposited on surfaces of insulating layer 29 in trench 35, opening 37 and vias 39 and 40. Conductive barrier layer 41 consists of a liner made from a refractory metal, a refractory metal nitride, or a refractory metal silicide, preferably Ta (40 nm), deposited using physical vapor deposition (PVD). In general, layer 41 can be deposited using chemical vapor deposition (CVD), PVD or ionized physical vapor deposition (IPVD), or any other method known in the art to deposit thin conductive films. If plated copper is used as the primary conductor, a copper seed layer (not shown) is next deposited by a PVD, sputtering, or other known process, having a thickness of 50 to 150 nm (not shown). Finally, a thick copper layer 43 is electroplated onto the copper seed layer. Although electroplated copper is described above, any conductive metals or semiconductors could be used to fill the wire trenches and vias to form the capacitors described herein.

Figure 1D:
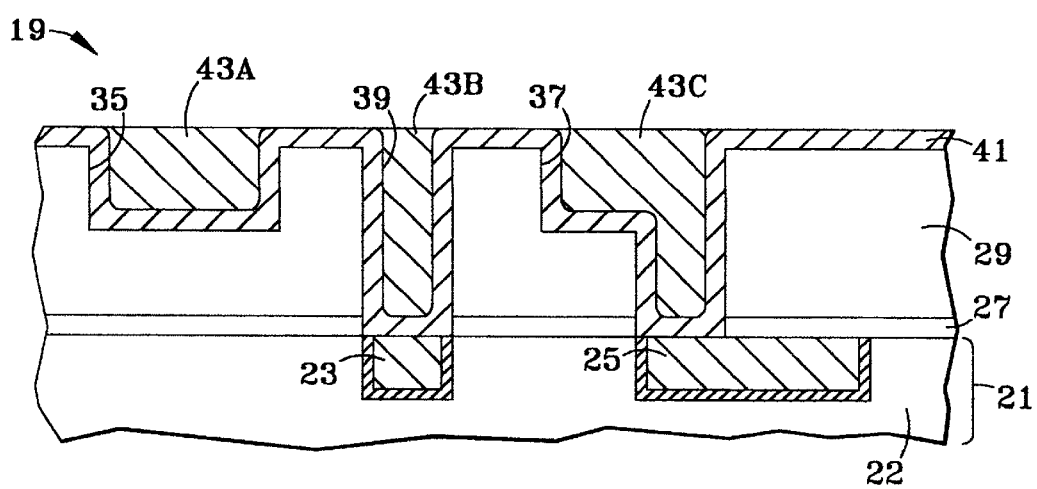

Excess copper in copper layer 43 is then removed with a chemical-mechanical polishing step (CMP) down to barrier layer 41, as shown in FIG. 1D. Alternatively, copper etch back could be used for part or all of the copper removal. In a preferred embodiment, barrier layer 41 is a Ta layer and the planarization stops on the first Ta layer. This leaves copper layer 43A in the capacitor trench 35, copper layer 43B (i.e., a copper stud) in wire/via 39, and copper layer 43C in wire opening 37 and via 40. In some instances, the CMP step is referred to simply as a polishing or planarization step.

Figure 1E:
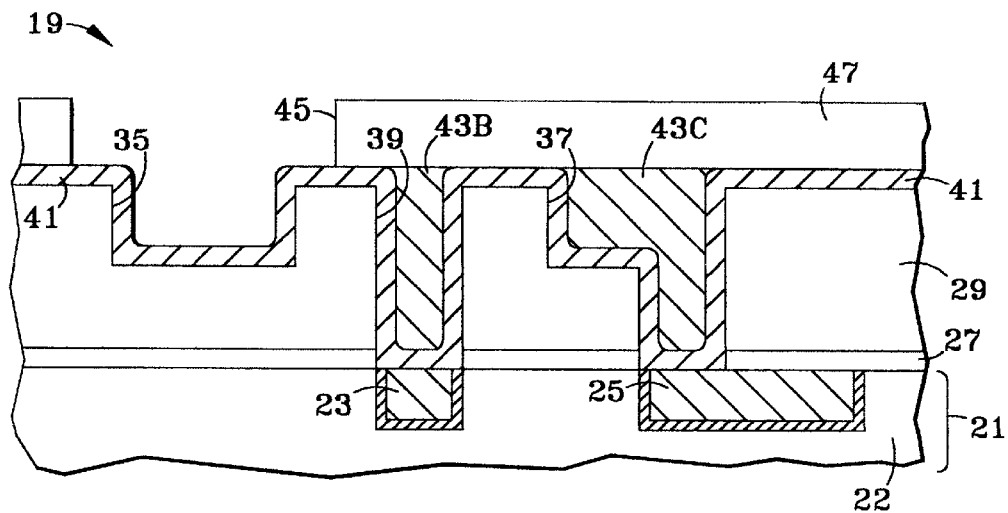

Referring to FIG. 1E, copper layer 43A is then removed from opening 45 by: a) depositing a photoresist layer 47, b) exposing it in the area of trench 35 with an appropriate mask, c) removing the exposed photoresist so as to create an opening 45 above copper layer 43A, and d) etching out copper layer 43A with a sulfuric peroxide acid. In etching out copper layer 43A a copper etchant selective to tantalum but not copper (or other top layer material used for barrier layer 41) is used, such as a sulfuric acid, hydrogen peroxide mixture diluted with water, e.g., one part $H_2SO_4$, one part $H_2O_2$ and 200 parts $H_2O$. This leaves the top portion of barrier layer 41 intact in trench 35. Then, the remaining portions of photoresist layer 47 are stripped from chip 19, followed by an optional solvent, acid, or plasma surface clean. Preferably, a solvent such as EKC would be used.

Figure 1F:
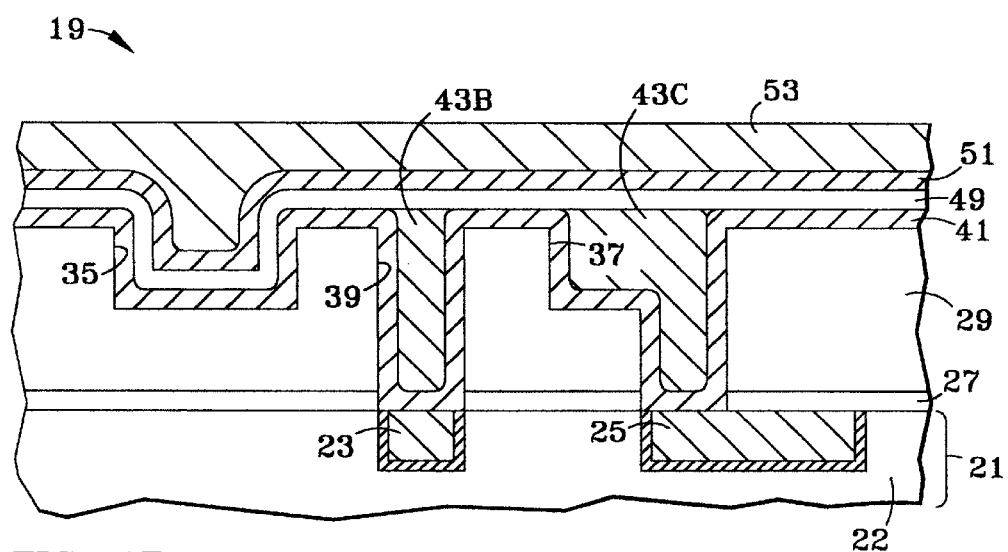

Next, as illustrated in FIG. 1F, a capacitor dielectric layer 49, consisting of one or more dielectric layers, is deposited. Typical dielectric materials used are $Ta_2O_5$ or $Si_3N_4$, but other materials having a relative dielectric constant K greater than 4, preferably about 7, may be used. Then, a second barrier layer 51 is deposited. This layer is preferably made from the same materials as barrier layer 41, i.e., one or more refractory metals and refractory metal compounds, and is topped with a thin copper seed layer. A degas step in vacuum, e.g., for about 3 minutes at about 400° C., followed by an argon sputter step (approximately 5–10 nm equivalent $SiO_2$ removal) with or without hydrogen or ammonia doping, would preferably be employed prior to depositing the capacitor dielectric 49 and second barrier layer 51. Finally, a thick copper layer 53 is then electroplated onto second barrier layer 51.

Figure 1G:
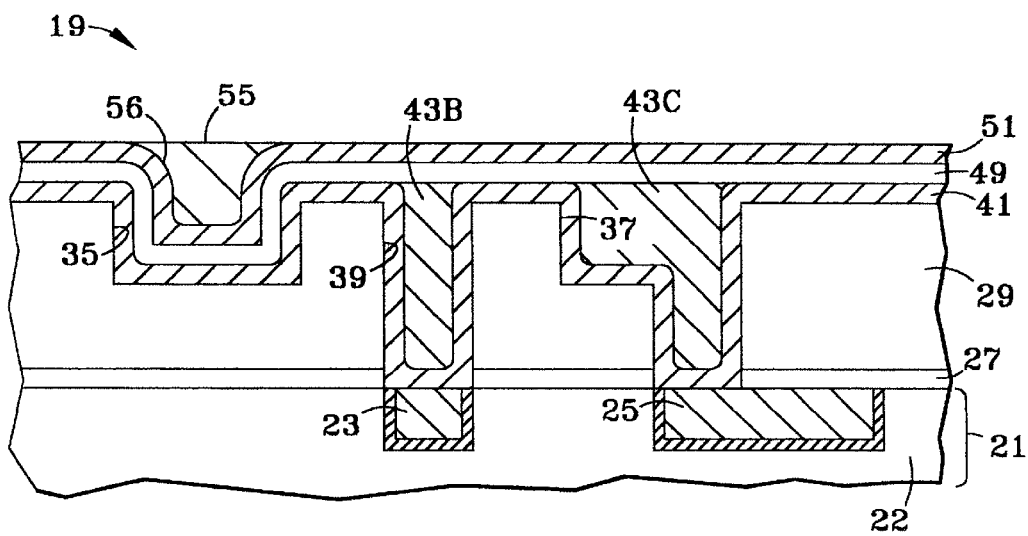

Referring to FIG. 1G, copper layer 53 is then removed by a CMP polishing step. Copper layer 53 is only removed to the upper surface of second barrier layer 51. This leaves copper plate 55 in opening 56 above trench 35. Copper plate 55 will form the upper plate of the capacitor of this embodiment of the invention.

Figure 1H:
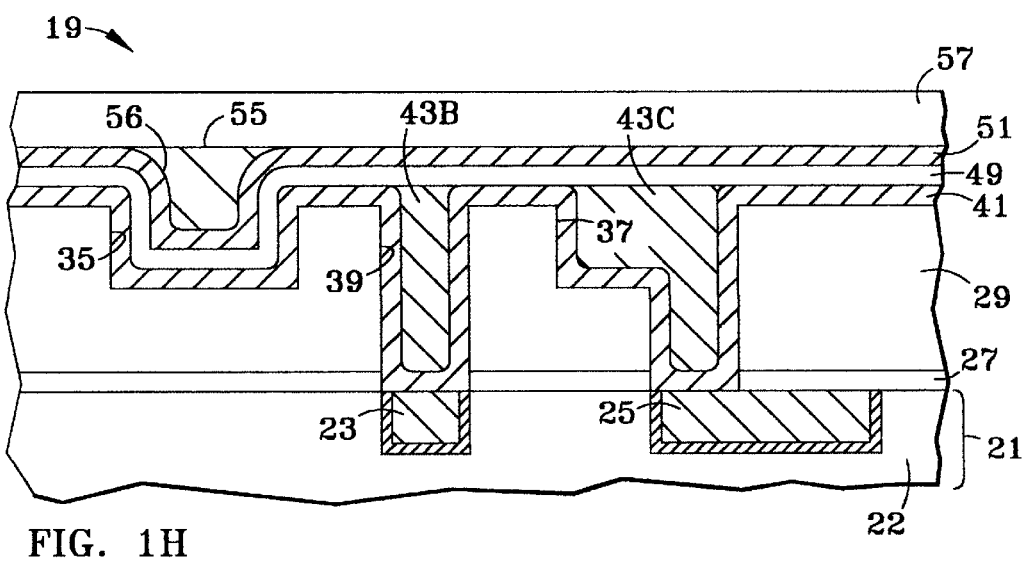
Figure 1I:
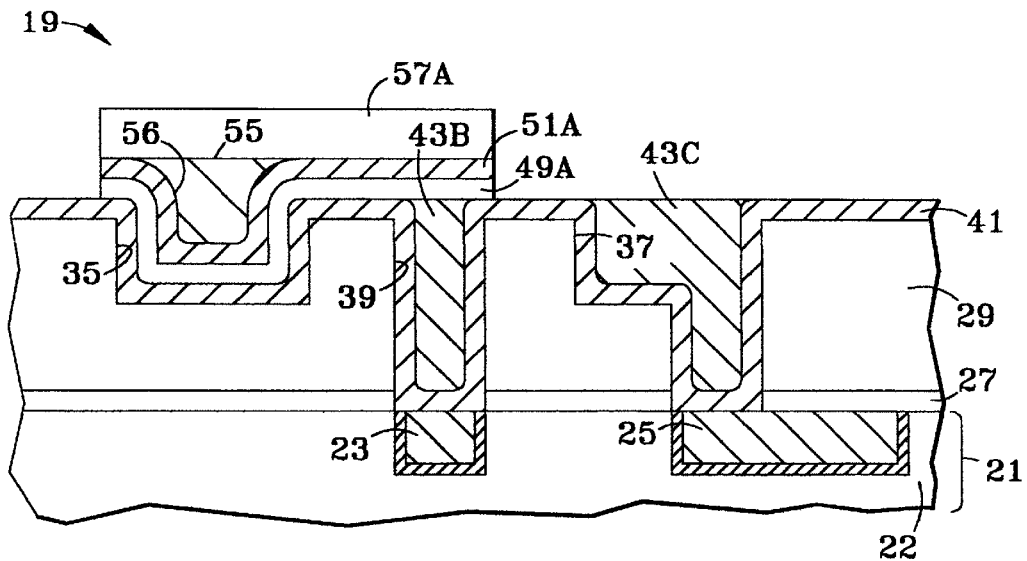

Next, as shown in FIG. 1H, a photoresist layer 57 is deposited on second barrier layer 51 and copper plate 55. Then, as depicted in FIG. 1I, photoresist layer 57 is patterned and removed everywhere except for portion 57A over via 39 and trench 35. Next, a RIE process is used to remove portions of barrier layer 51 not covered by photoresist portion 57A. Conventional RIE chemistries including $SF_6$, HCl, or $BCl_3$ are used. Alternatively, if barrier layer 51 is composed of a metal which has a relatively high fluorine etch byproduct volatility (e.g., tungsten), then a perfluourocarbon (PFC) and oxygen-based RIE chemistry could be employed. Finally, portions of dielectric layer 49 not covered by photoresist portion 57A are etched away using a PFC, or a hydrofluorocarbon-based RIE chemistry, e.g., $CF_4$ or $CHF_3$. In any event, the etching chemistries used for removal of portions of dielectric layer 49 are chosen to avoid etching the underlying copper portions 43B, 43C and 55. Photoresist portion 57A can be removed either before or after layer 49 is etched.

Figure 1J:
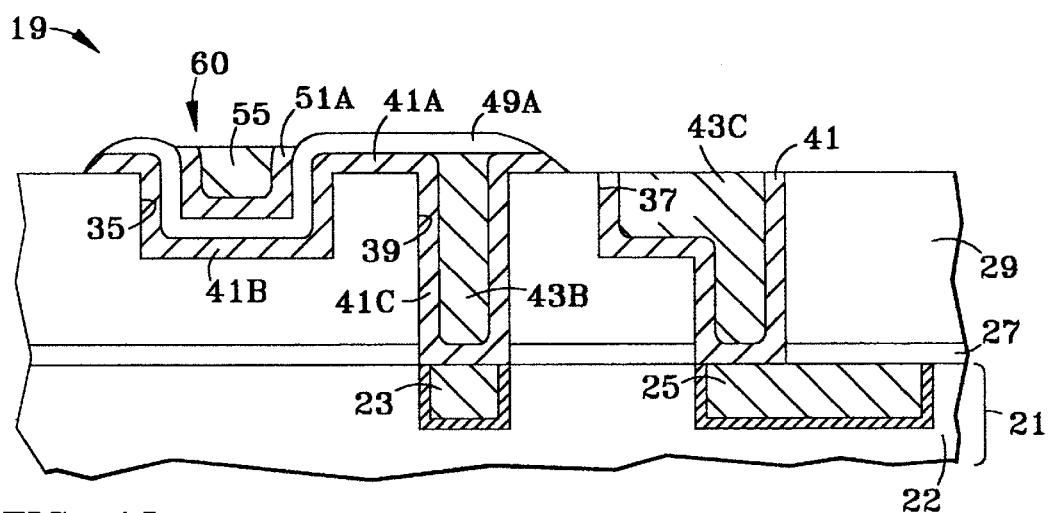

Turning to FIG. 1J, second barrier layer 51A, which was protected under the photoresist layer 57A, is polished off in a CMP step, leaving the dielectric layer portion 49A. Horizontally-extending portions of first barrier layer 41, excluding those portions covered by dielectric layer portion 49A, are also removed in this CMP step, as shown in FIG. 1H. During this CWP step, dielectric layer portion 49A protects strap portion 41A of barrier layer 41. Strap portion 41A connects lower plate portion 41B of the barrier layer to via liner portion 41C of the barrier layer. The CMP processes used in tie step of the process illustrated in FIG. 1J are known as selective two-step CMP processes. First, a copper CMP process which has relatively high copper CMP removal rate and low CMP removal rate for the materials of barrier layer 41 is employed such that the copper above the wafer surface is removed leaving most of the barrier layer 41 intact. Next, a liner or barrier layer CMP process is employed which has relatively low copper CMP removal rate and high CMP removal rate for the materials of barrier layer 41.

A modification to the process sequence resulting in the structure shown in FIG. 1J is encompassed by the present invention After photoresist portion 57A is formed, portions of second barrier layer 51, dielectric layer 49 and barrier layer 41 not covered by portion 57A may be removed in a single RIE process with selection of appropriate etch chemistries. These chemistries, which would be changed during the process, are initially similar to the ones discussed above in reference to dielectric layer 41 and second barrier layer 51, followed by a change to a chemistry similar to the one discussed for 51 to etch dielectric Layer 49.

Thus, FIG. 1J depicts the first version of capacitor 60 of the present invention prior to completion of the next layer of metalization. The lower plate of capacitor 60 is formed from lower plate portion 41B. The upper plate of capacitor 60 is formed from copper plate 55. Dielectric layer portion 49A forms the dielectric layer of capacitor 60. Strap portion 41A connects lower plate portion 41B of capacitor 60 with linear portion 41C in via 39, which in turn is connected to interconnect 23. Dielectric layer 49A forms a protective covering over strap portion 41A.

Figure 1K:
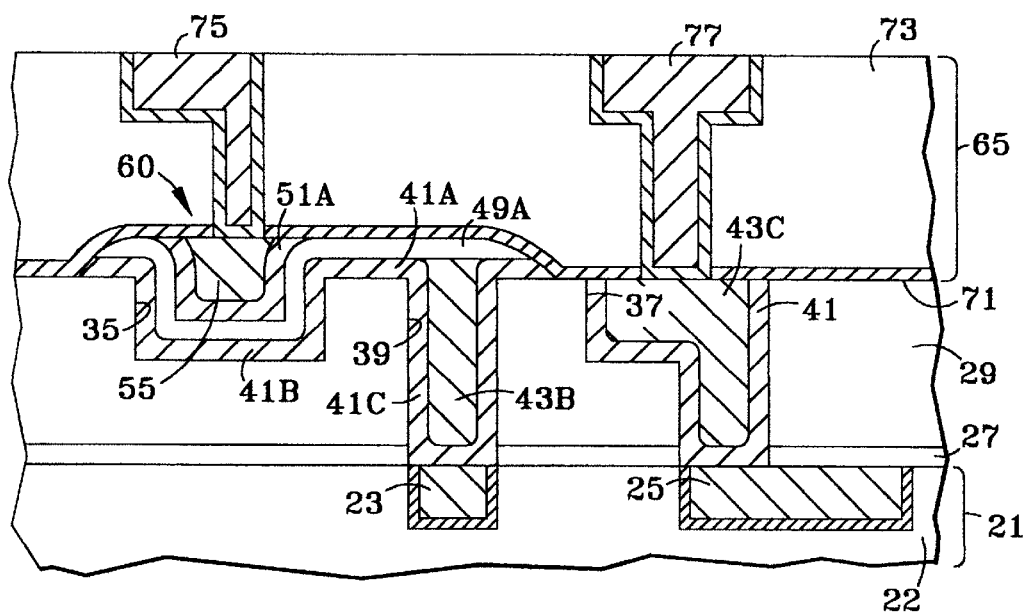
Figure 1K:
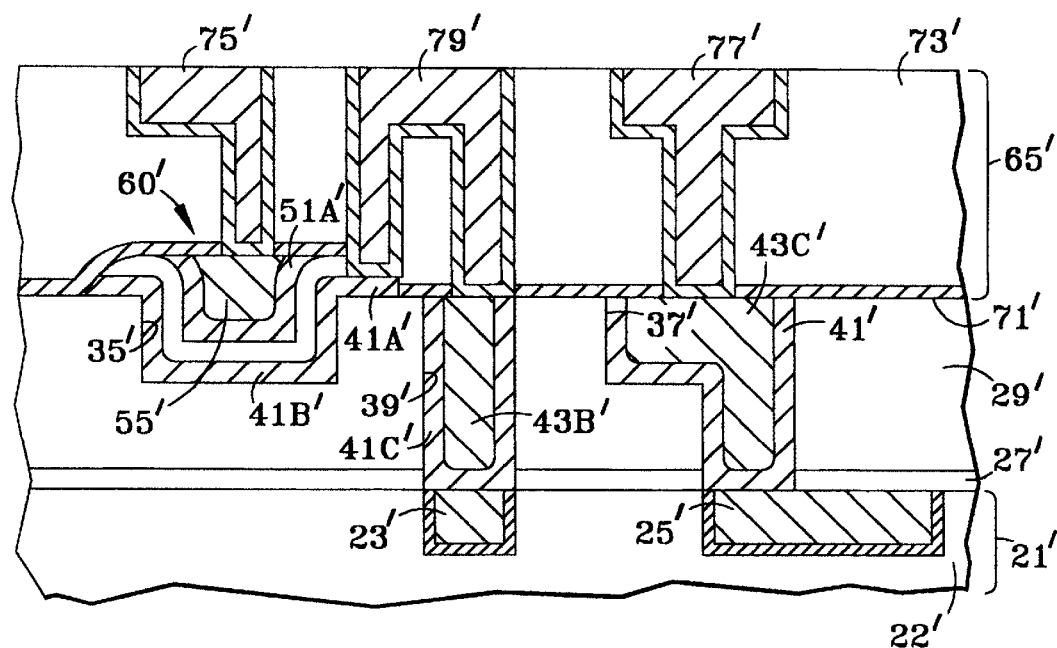

Turning now to FIG. 1K, copper plate 55 (i.e., the upper plate) of capacitor 60 and copper layer 43C are typically connected to other portions of chip 19 via the next metalization layer 65. This layer typically includes an insulating layer 71 made from materials such as those used to form insulating layer 27. An insulating layer 73 is deposited on top of insulating layer 71. Vertical interconnects 75 and 77 are provided in insulating layer 73 and extend through the insulating layer and barrier layer 71 so as to contact, respectively, copper plate 55 and copper portion 43A. Bottom plate 41B of capacitor 60 is connected via surface strap 41A to interconnect 23 in lower metal interconnection level 21.

20 Referring now to FIGS. 1I, 1K and 1K', in some cases it may be desirable to create a break in strap portion 41A such that it is not connected with portion 41C in via 39. For example, as shown in FIG. 1K', strap portion 41A' is not connected to portion 41C'. To connect lower plate 41B' with interconnect 23 in metal interconnect level 21, an interconnect 79' having an inverted U-shaped configuration is formed in metal interconnect level 65'. Interconnect 79' is formed to connect strap portion 41A' with portion 41C' and copper layer 43B', which in turn connects the strap portion, and hence lower plate 41B', with interconnect 23. Interconnect 79' is made in the same manner as interconnects 75 and 77, as described above.

The process for making the embodiment illustrated in FIG. 1K' is identical to that described above with respect to the embodiment of FIG. 1K, with one exception. In the step illustrated in FIG. 1I, resist layer 57 is photo-patterned so as to remove a greater portion of second barrier layer 51A and dielectric layer 49A. More particularly, in the step analogous to that shown in FIG. 1I, portions of second barrier layer 51A' and dielectric layer 49A' are removed so as not to cover via 39' and so as to terminate at the left side of interconnect 79', as indicated in FIG. 1K'. The consequence of this alternate process step is the break between strap portion 41A' and portion 41C' discussed above.

Figure 2A:
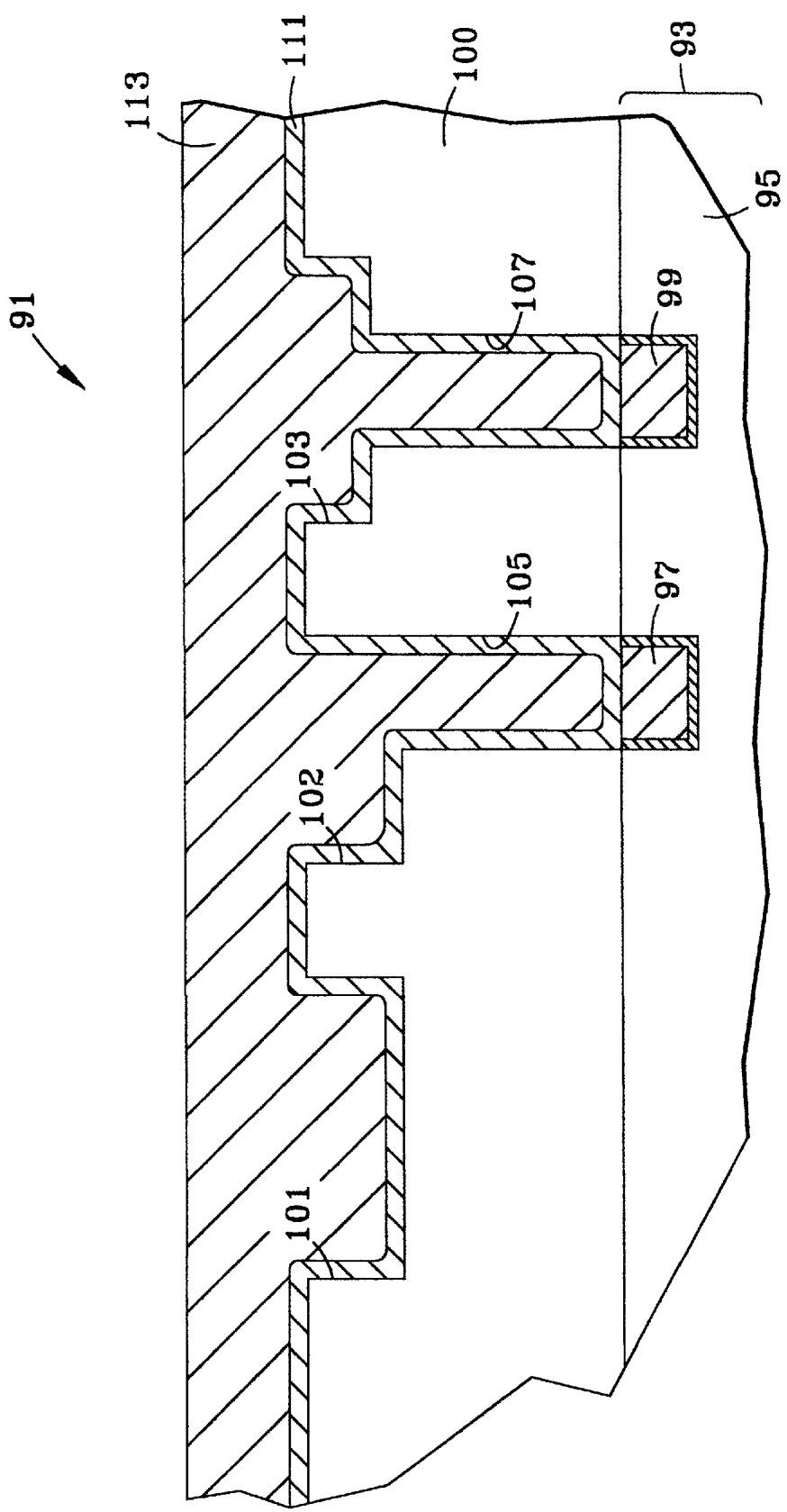
FIGS. 2A–2G are schematic, cross-sectional views of the steps of another embodiment of the method of fabricating a capacitor in a semiconductor device.

FIGS. 2A–2G illustrate another method of fabricating the first version of the invention described above. FIG. 2A depicts a portion of a chip 91 having devices fabricated thereon up through a metal interconnect level 93 including an insulator layer 95 with metal interconnects 97 and 99 embedded therein. Planar insulating layer 100 is then formed on metal interconnect layer 93. Insulating layer 100 may be made from the same materials as insulating layer 25, as described above, and is preferably planarized using a CMP process. Standard photo-patterning and etching is then done to define capacitor opening 101 and wire openings 102 and 103 in insulating layer 100. The process is done in two steps: i) capacitor opening 101 and wire openings 102 and 103 are formed during one mask/etch/strip step, and ii) vias 105 and 107 are formed during another mask/etch/strip step. A standard barrier layer 111 is then created by depositing standard Ta liner, and then a copper seed layer, or any of the other materials described above as suitable for barrier layer 41. Finally, a thick layer 113 of electroplated copper is deposited.

Figure 2B:
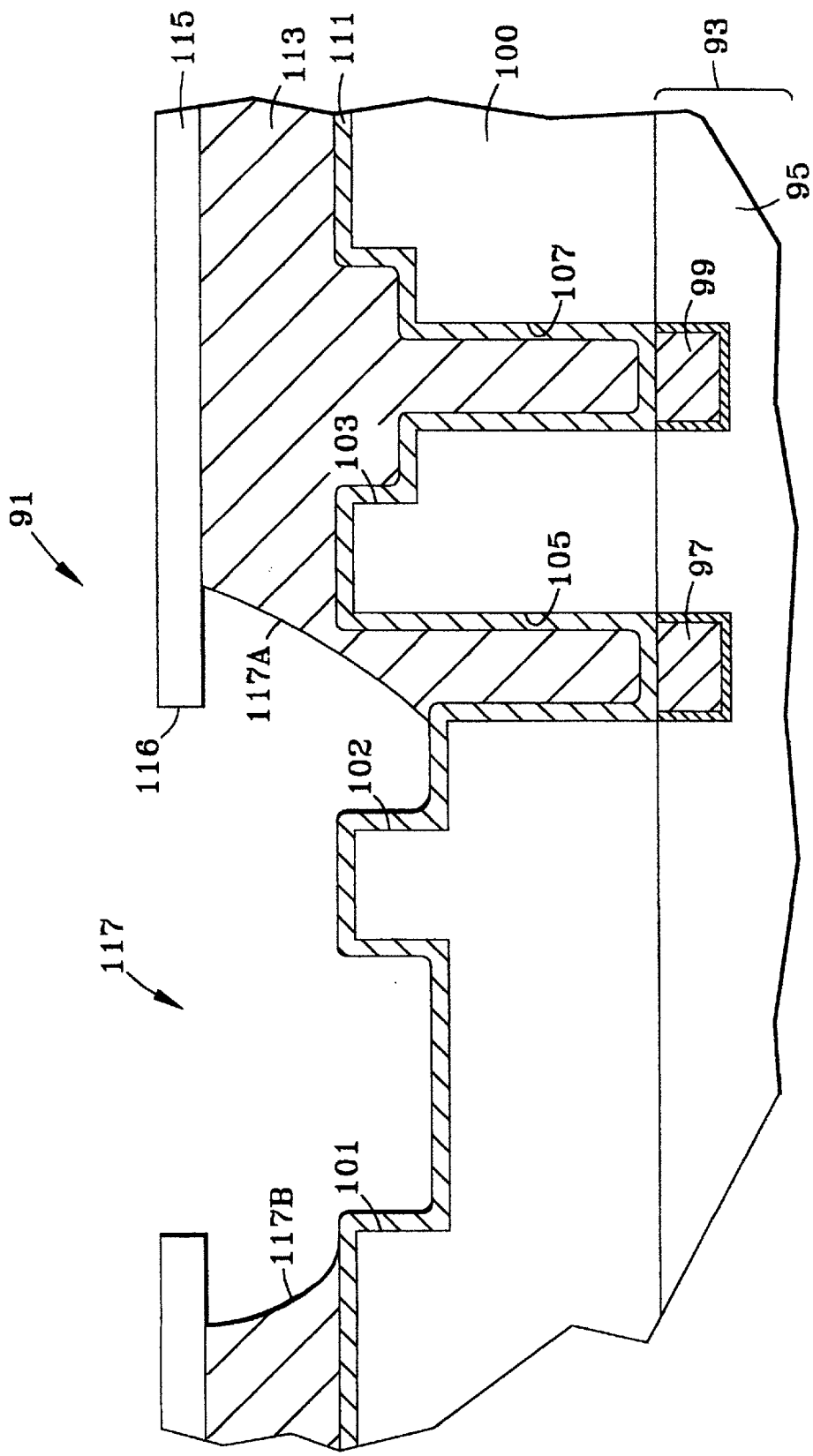

Next, as shown in FIG. 2B, photoresist layer 115 is deposited and patterned to create opening 116 over capacitor opening 101 and over a portion of wire opening 102, as shown. Portions of copper layer 113 beneath opening 116 are then removed by an isotropic wet etch process to create opening 117. The isotropic etch causes opening 117 to extend laterally under photoresist layer 115 to create the opening areas 117A and 117B. Sulfuric peroxide (i.e., a sulfuric acid and hydrogen peroxide combination) is preferably used in this process. In the preferred embodiment it is diluted to 200:1, i.e., 200 parts water to 1 part sulfuric peroxide. The etch is conducted for a period of time sufficient to achieve the profile depicted in FIG. 2B. With this profile, opening area 117A intersects trench 102. The etch time will depend on the density of the copper, temperature of the bath and percentage of the hydrogen peroxide in the bath, and can be readily determined empirically by one of ordinary skill in the art by routine process optimization. The wet etching is selectively done to remove the copper in opening 117, and to stop on the upper surface of barrier layer 111. Naturally, the wet etch of the copper also removes part or all of the copper seed layer deposited on barrier layer 111. Alternatively, a RIE etch, either anisotropic or isotropic, can be employed to remove copper layer 113. The RIE etch must be controlled so that it does not substantially etch conductive liner layer 111. Once the wet etch step is completed, the remaining portions of photoresist layer 115 are removed, followed by wafer surface cleaning as discussed previously.

Figure 2C:
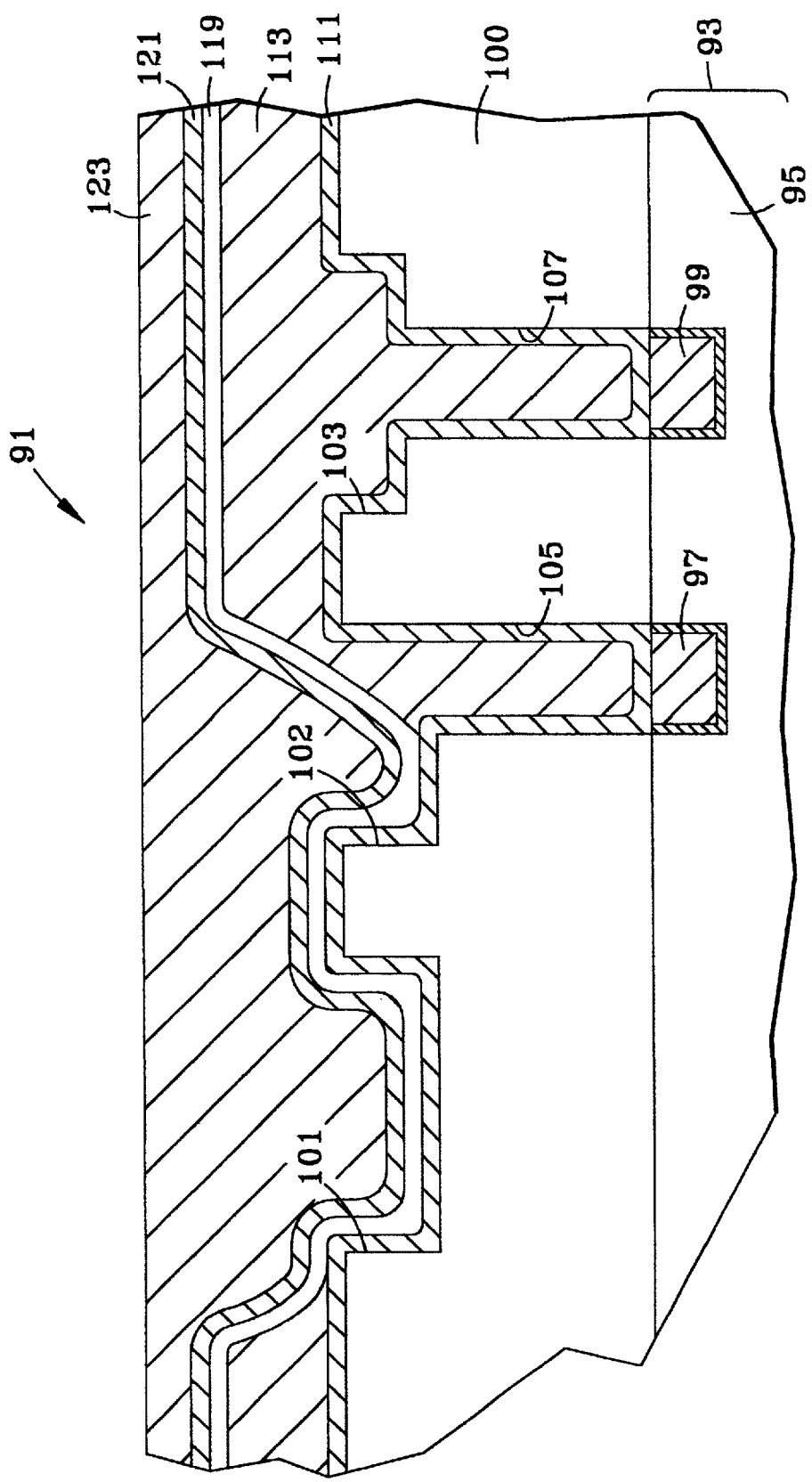
Figure 2D:
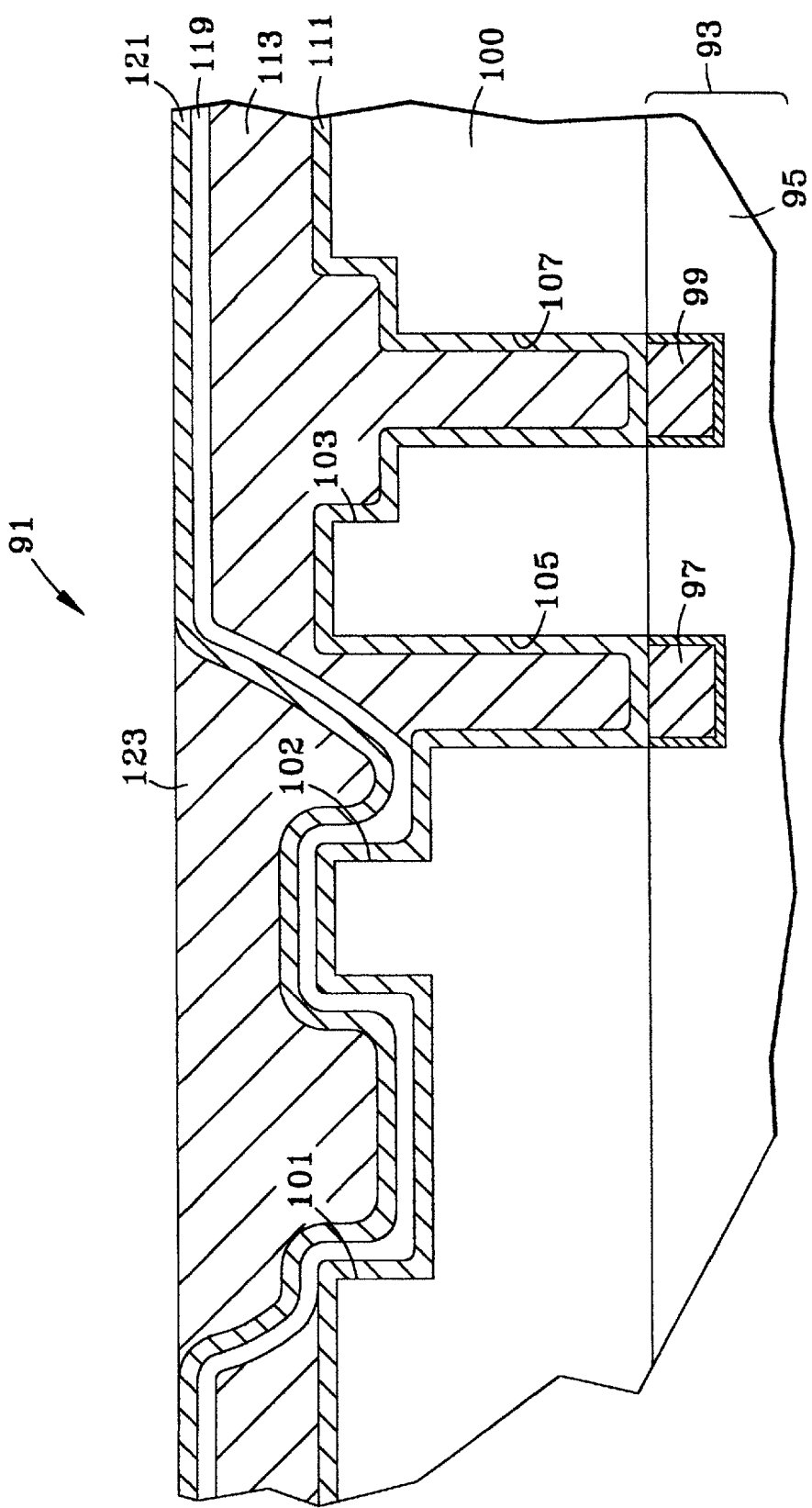
Figure 2E:
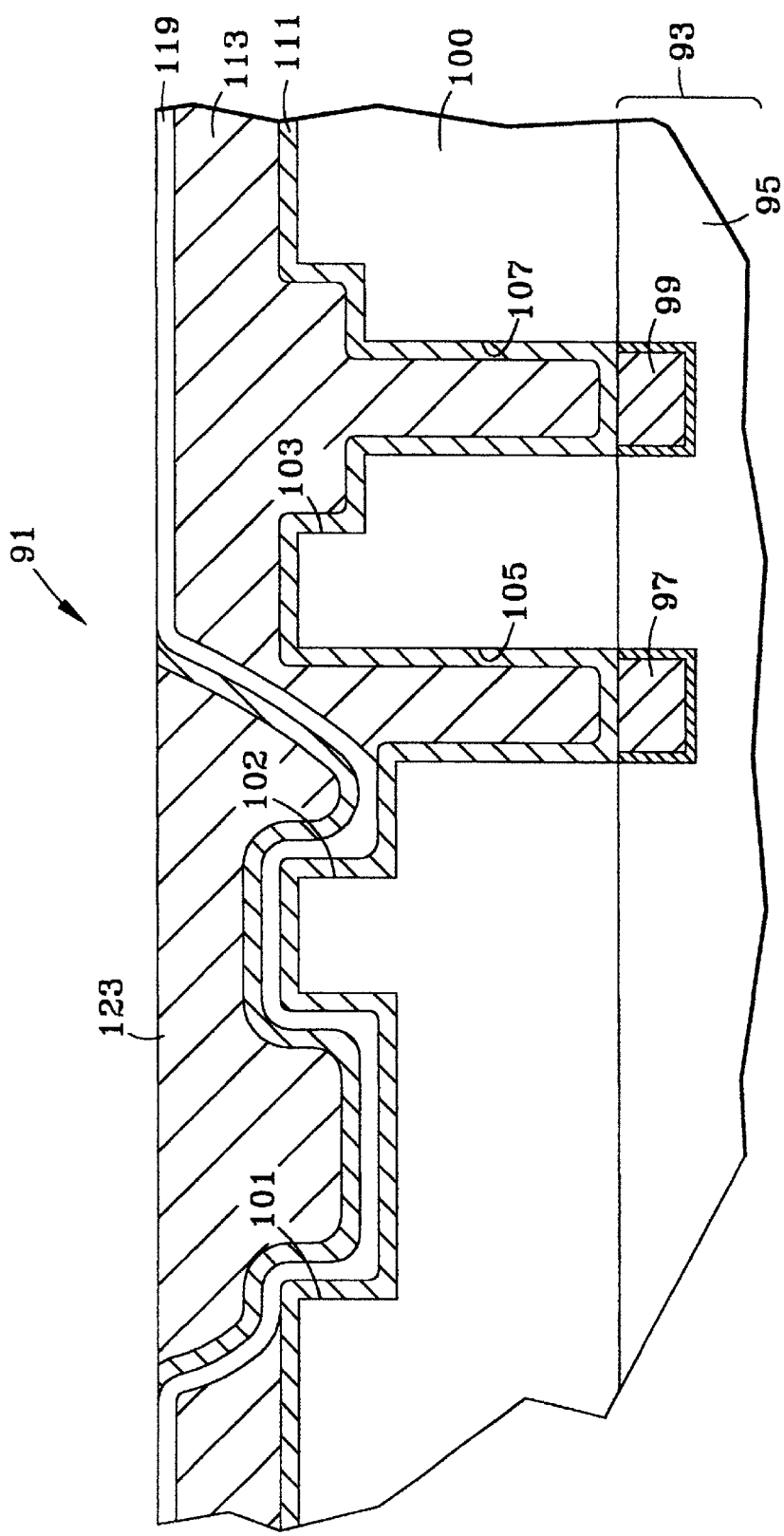

During the next step, as shown in FIG. 2C, a high relative K capacitor dielectric layer 119 is deposited. Layer 119 is made from the same materials as dielectric layer 49, as described above. Then, barrier layer 121 is deposited on dielectric layer 119. Barrier layer 121 is made from the same materials as barrier layer 41, as described above. A thick layer 123 of copper is then deposited by electroplating on barrier layer 121. Copper layer 123 will typically be a 0.5 to 2 microns thick. As depicted in FIG. 2D, a copper CMP step is employed to remove layer 123, stopping on layer 121. Next a barrier or liner CMP step is employed to remove layer 121, stopping on layer 119, as shown in FIG. 2E.

Figure 2F:
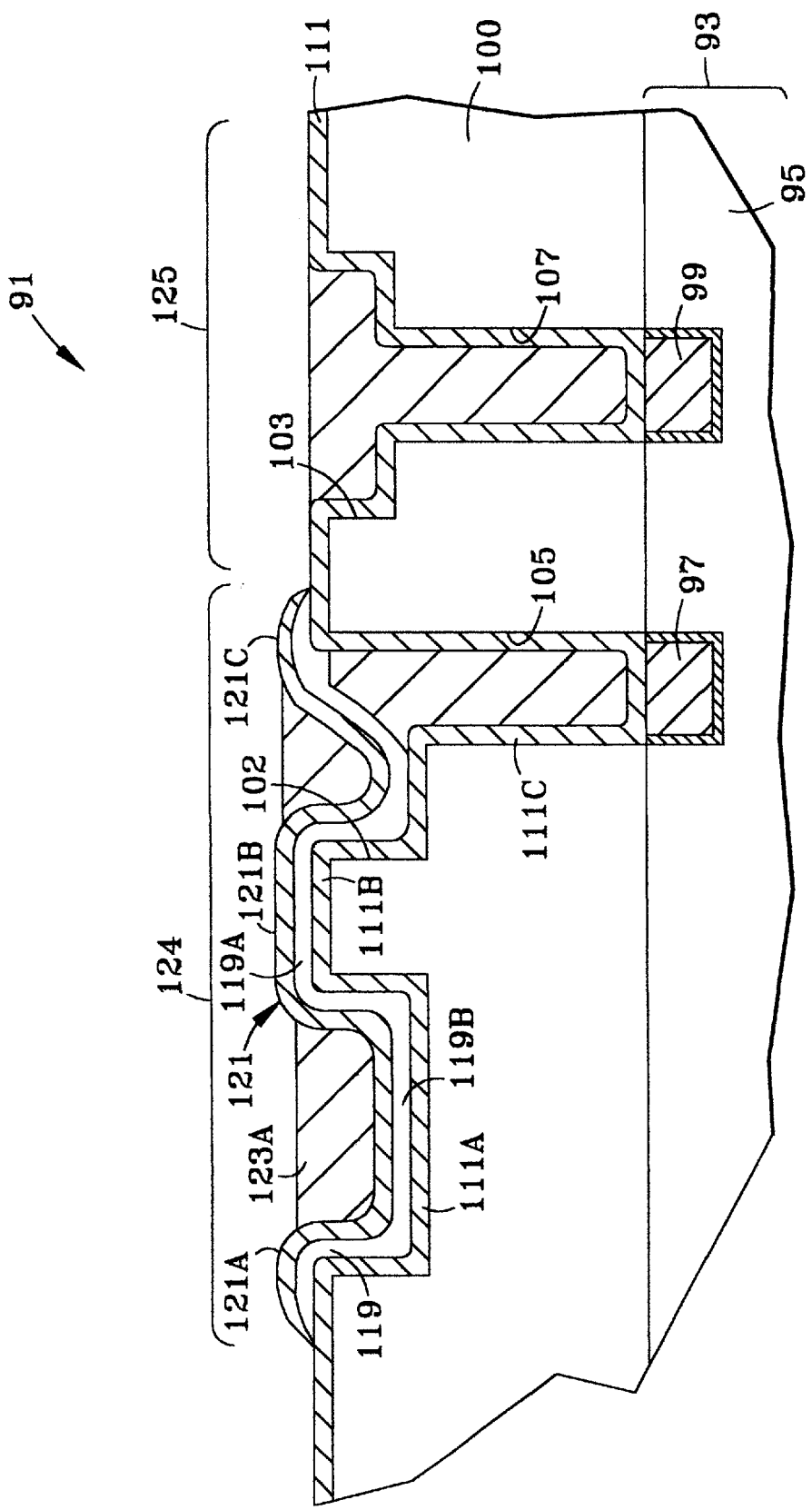

As depicted in FIG. 2F, a CMP polishing step is then performed to remove dielectric layer 119 and copper layer 113 down to upper barrier layer 121 in capacitor and strap connection area 124 down to lower barrier layer 111 in wiring via region 125 and elsewhere.

Figure 2G:
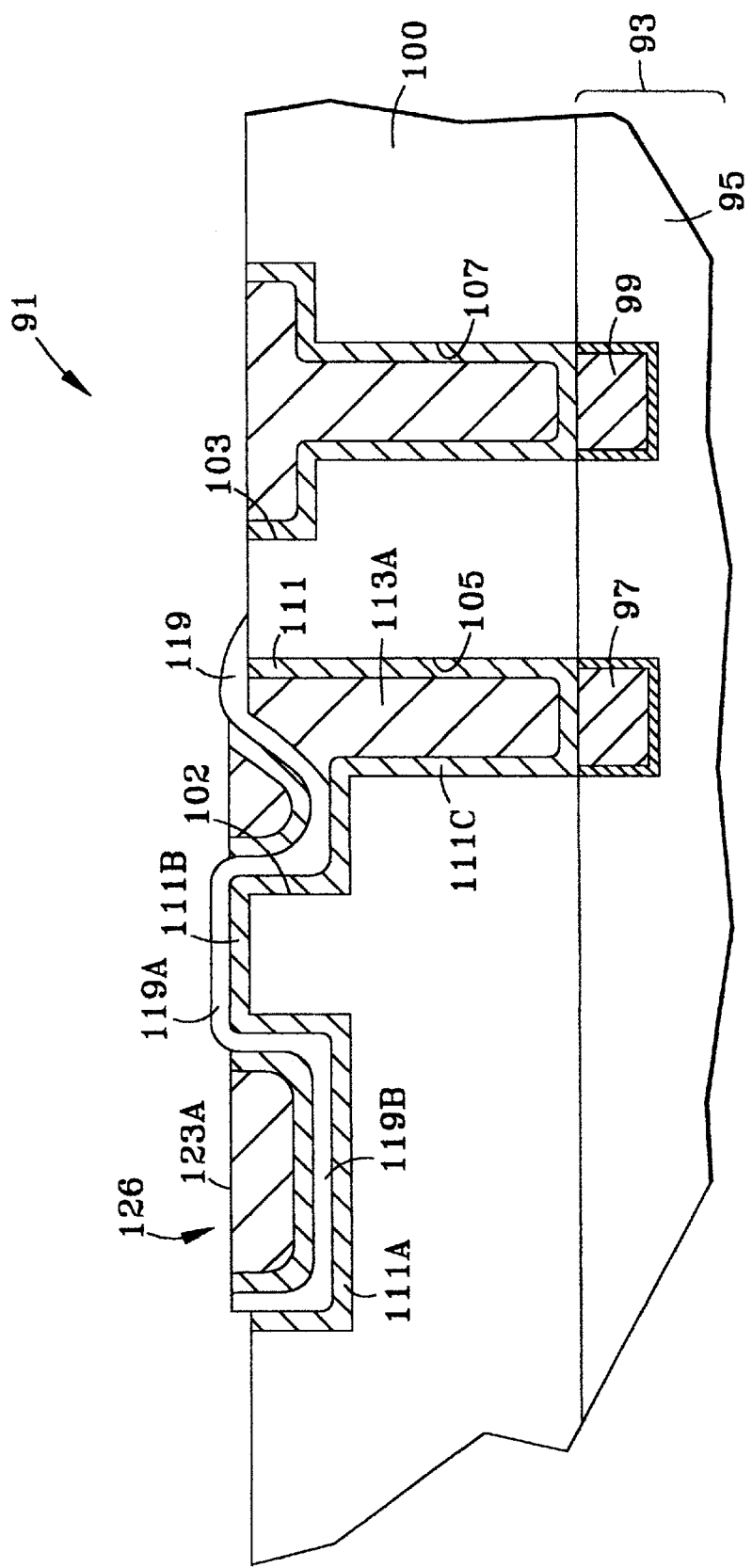
Figure 2B:
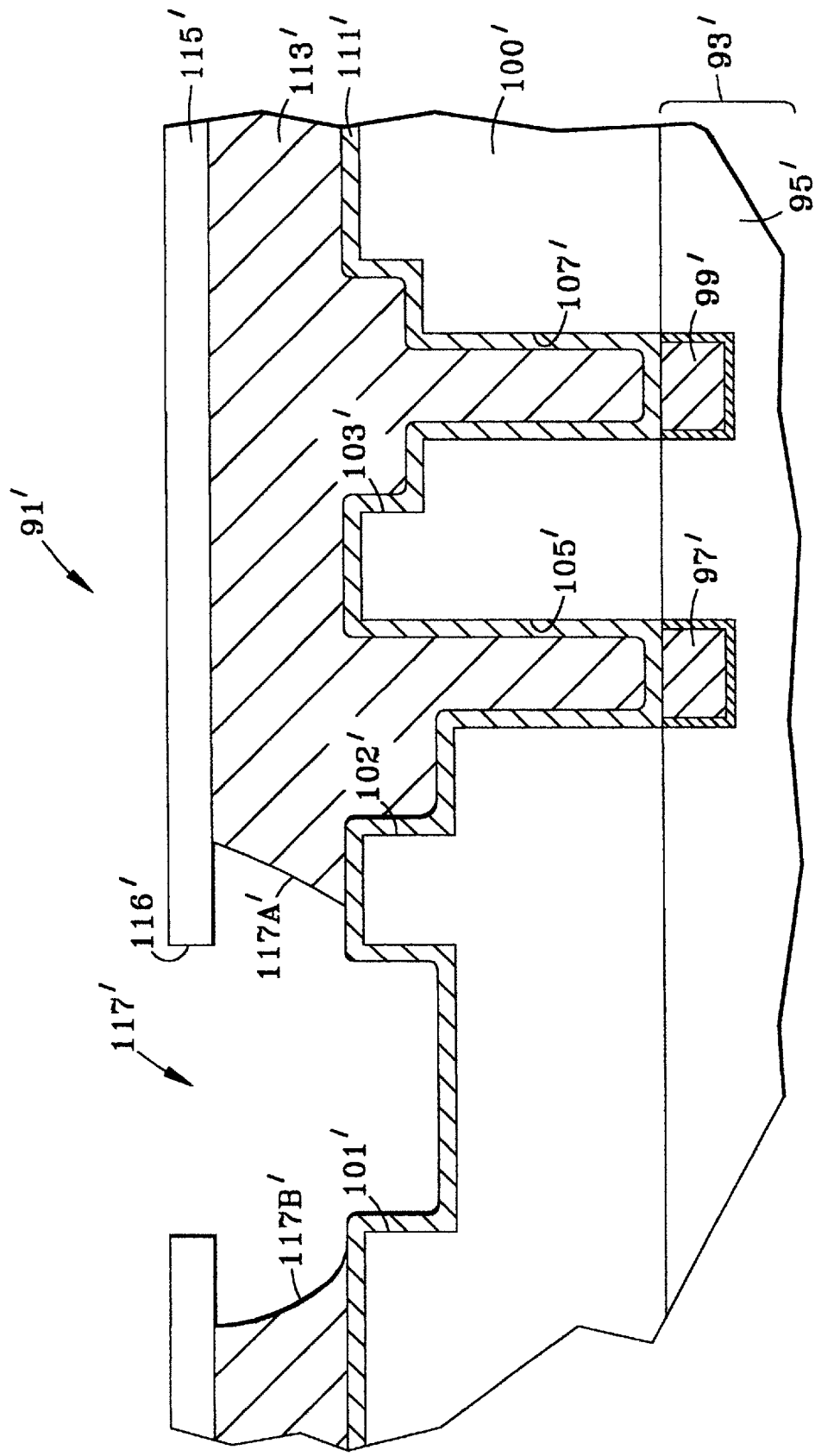
Figure 2C:
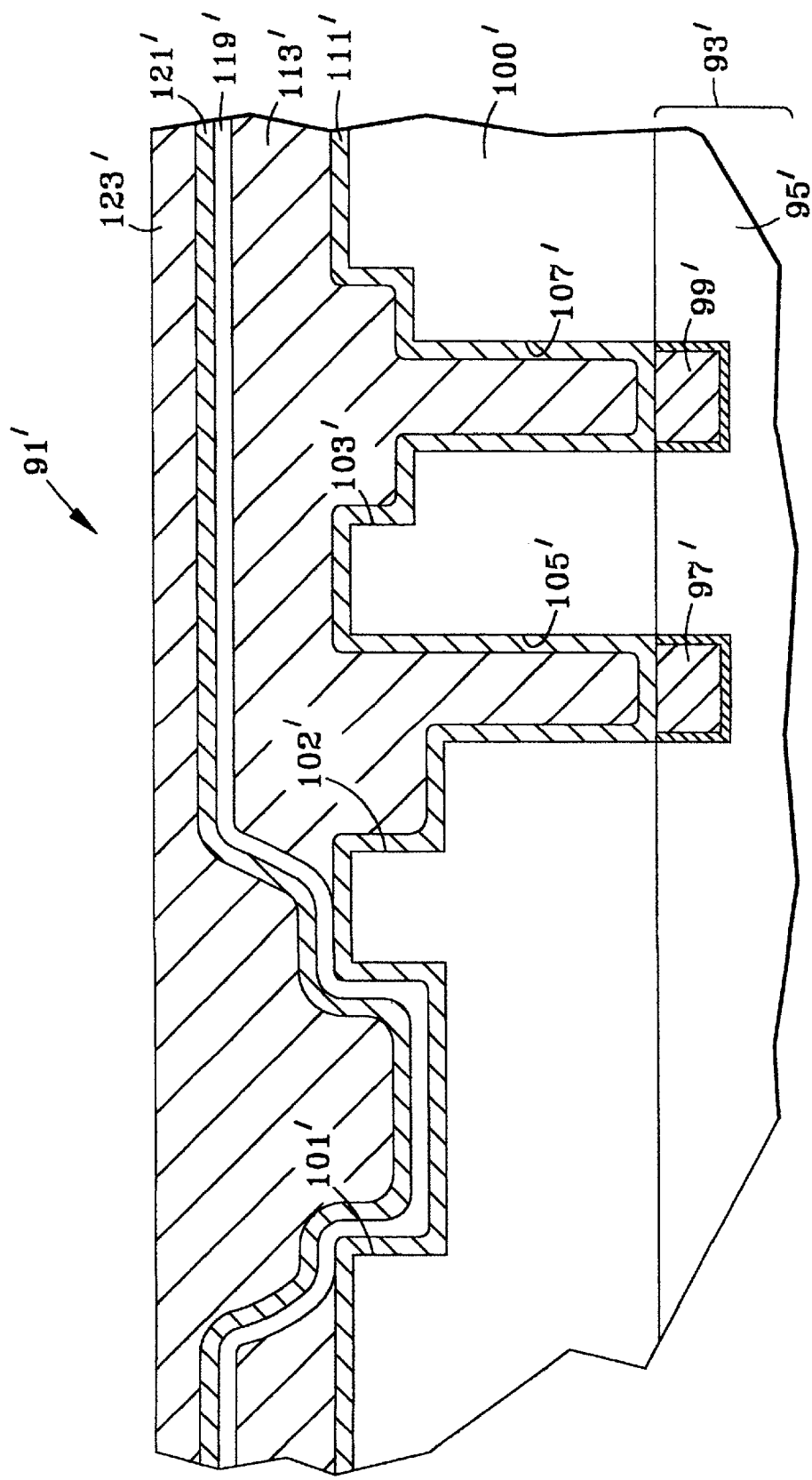
Figure 2D:
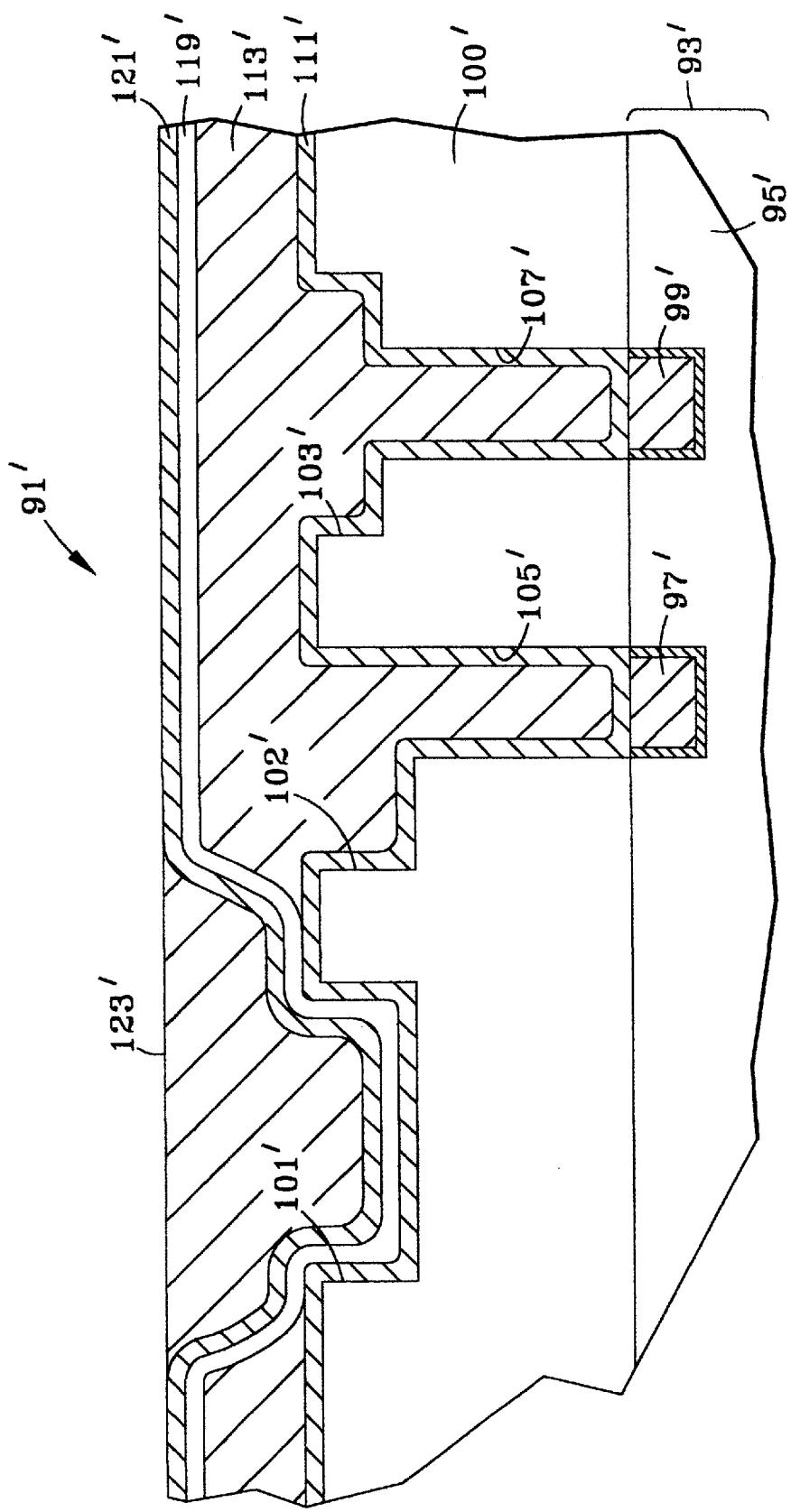
Figure 2E:
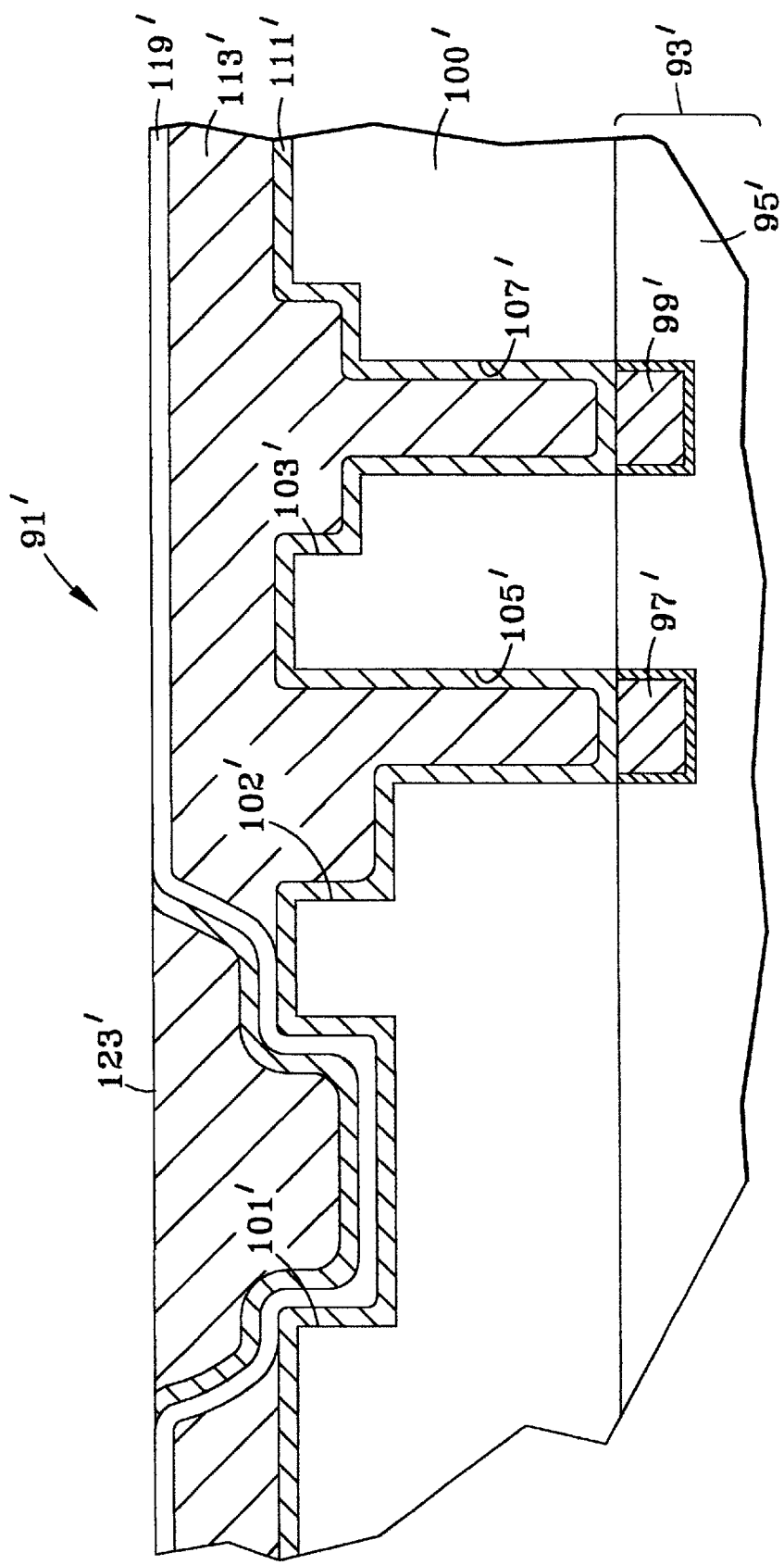
Figure 2F:
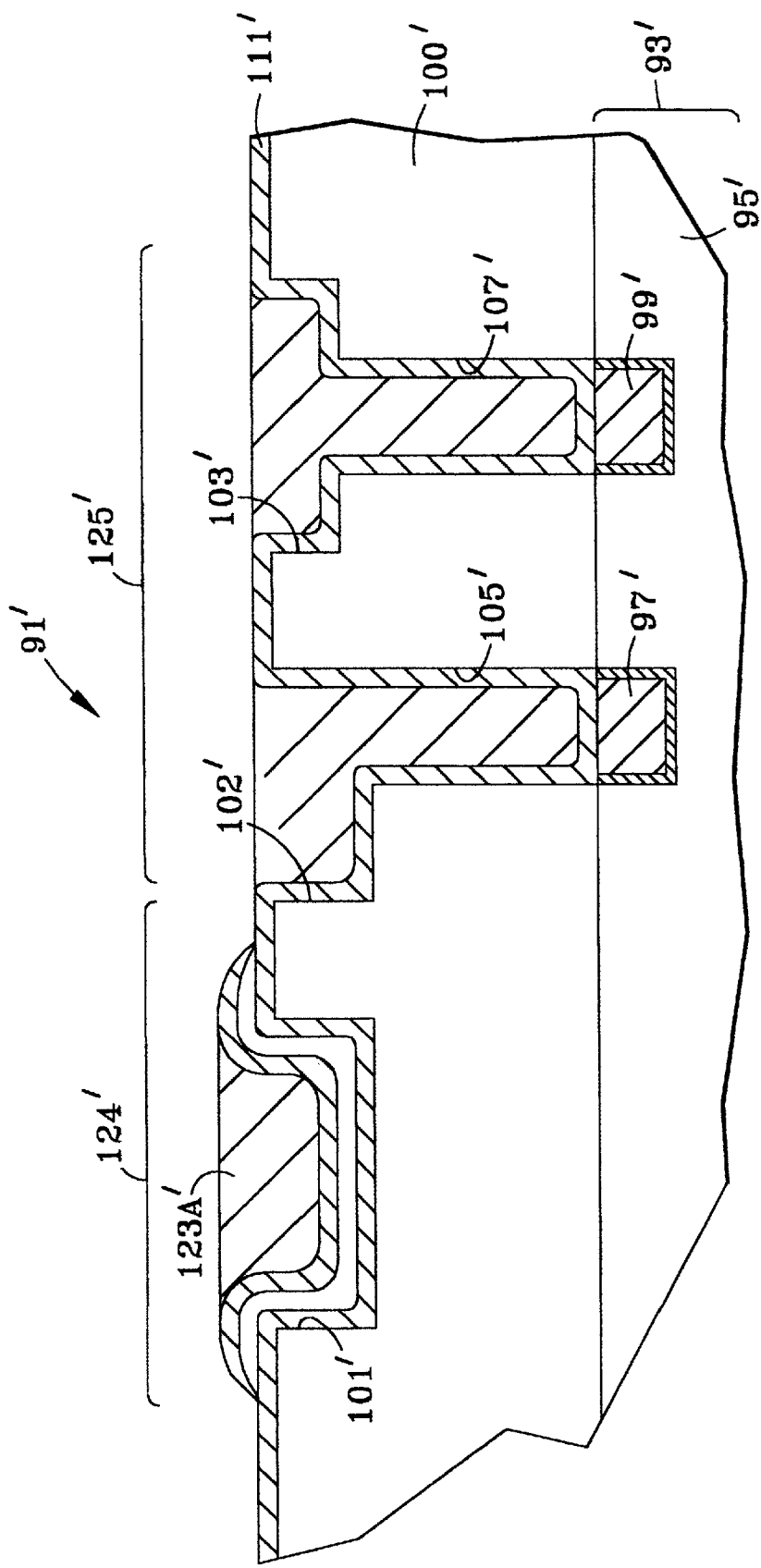
Figure 2G:
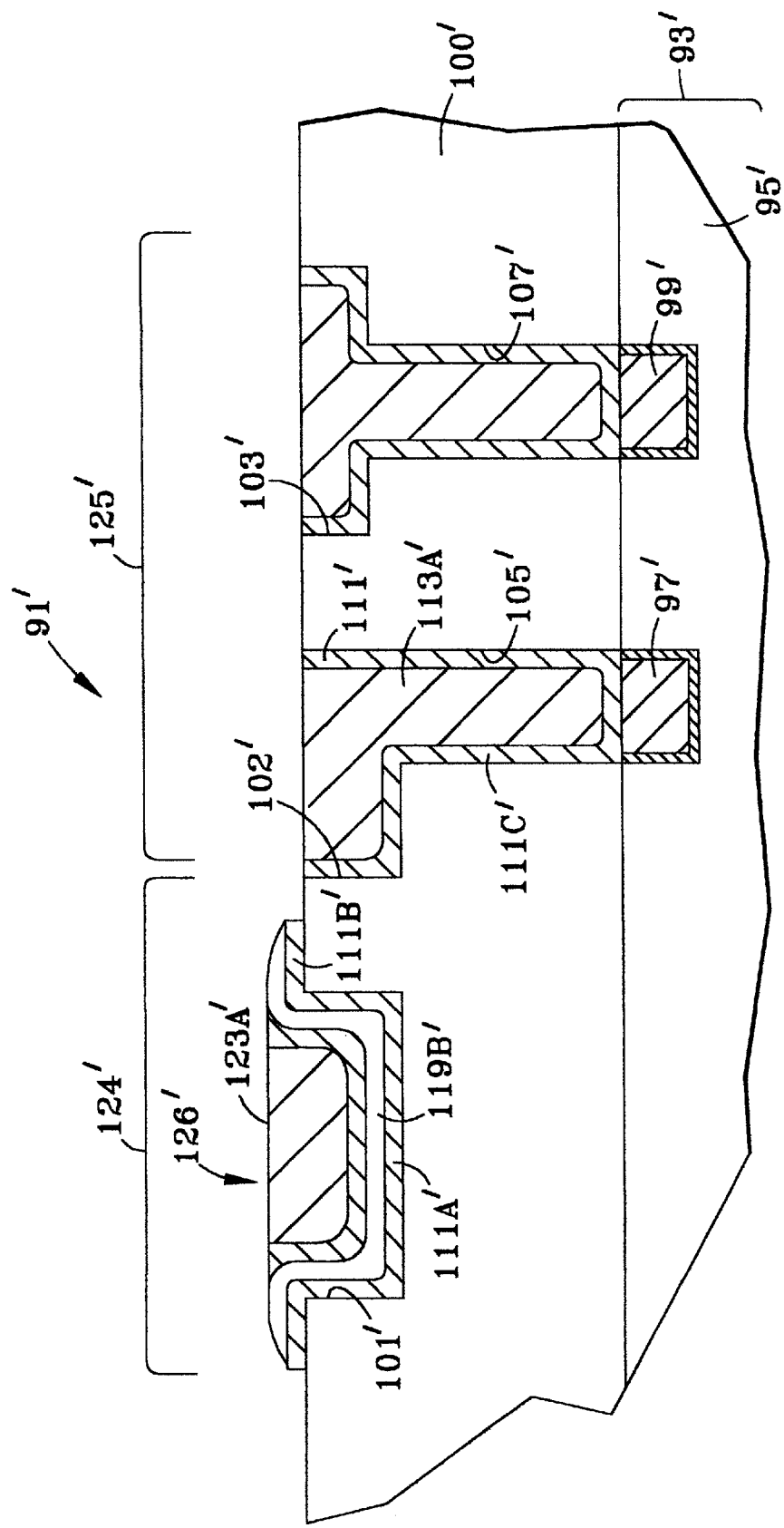

An additional CMP step is performed to remove upper portions 121A, 121B and 121C of barrier layer 121, which remain after the first CMP step, but to leave in place strap cover portion 119A (FIG. 2F). This CMP step also removes all exposed portions of the first barrier layer 111, but leaves in place strap portion 119A of dielectric layer 119. FIG. 2G depicts chip 91 after completion of the second CMP process.

Completed capacitor 126 shown in FIG. 2G includes lower plate 111A, capacitor dielectric portion 119B, and top plate 123A. Strap contact 111B connects lower plate 111A of capacitor 126 to barrier layer portion 111C in adjacent via 105, which in turn is connected to interconnect 97 in metal interconnect level 93. Strap cover portion 119A of the second dielectric layer 119 shields strap contact 111B. Although not illustrated, top plate 123A of capacitor 126 is typically connected to an upper metalization level, such as level 65 described above and illustrated in FIG. 1K.

The present invention encompasses a slight variation on the embodiment illustrated in FIGS. 2A–2G and described above, which variation is illustrated in FIGS. 2B'–2G'. The steps illustrated in FIG. 2A are identical for both embodiments, and so a FIG. 2A' is not provided. Except as described below, the process steps and materials used for the embodiment shown in FIGS. 2B'–2G' are identical, respectively, to the ones described above and shown in FIGS. 2B–2G. In this regard, to indicate this commonality of process steps and materials, the reference numbers used in FIGS. 2B'–2G' are identical to those used in FIGS. 2B–2G, except that the prime notation is used in FIGS. 2B'–2G'.

The only difference in the embodiment of FIGS. 2B'–2G' relative to the embodiment of FIGS. 2B–2G arises from a slight variation in the process step performed in FIG. 2B'. In this embodiment, opening 116' in resist mask 115' is positioned so that opening area 117' does not extend into trench 102' but instead extends between trench 101' and 102', as shown in FIG. 2B'. Next, fabrication of capacitor 126' proceeds as illustrated in FIGS. 2C'–2G' and as described above relative to FIGS. 2C–2G. As a consequence of not forming opening area 117' so that it does not extend into trench 102', lower plate 111A' is not connected by surface strap 111B' to barrier layer portion 111C'. As a result, lower plate 111A' is not connected to interconnect 97' in lower metal interconnection level 93'. Accordingly, it is necessary to provide a vertical interconnect in a metal interconnection level above capacitor 126', such as vertical interconnect 77 in level 65 shown in FIG. 1K', that makes contact with surface strap 111B'.

The embodiments of the invention depicted in FIGS. 1A–1K and 2A–2G provide structures for connecting a bottom plate of a capacitor in a damascene trench with an adjacent wiring interconnect using a surface strap extending between the bottom plate and an electrically conductive liner in an adjacent, but separated, via connected to the wiring interconnect. In the embodiment of FIG. 1K', an interconnect 179' is used to achieve this interconnection. Such structures, as well as the structures of FIGS. 2A'–2G' are advantageous as they are particularly adapted for use in a copper dual damascene fabrication process. However, the present invention is not so limited. Indeed, all references to the use of copper provided above in connection with the discussion of FIGS. 1A–1K, 1K', 2A–2G and 2B'–2G' should be interpreted to include metals other than copper such as aluminum, aluminum/copper alloys, and refractory metals such as tungsten and titanium. When materials other than copper are used, it may be acceptable under some circumstances to omit upper barrier layers 51, 51', 121 and 121' or to make lower barrier layers 41, 41', 111 and 111' from electrically conductive materials that are not necessarily a barrier to the diffusion of copper.

FIGS. 3A–3E and 4A–4B illustrate two embodiments of a second version of the present invention. The decoupling capacitor of this version is ideally suited for application where long parallel wiring runs including numerous vias are desirable.

Figure 3A:
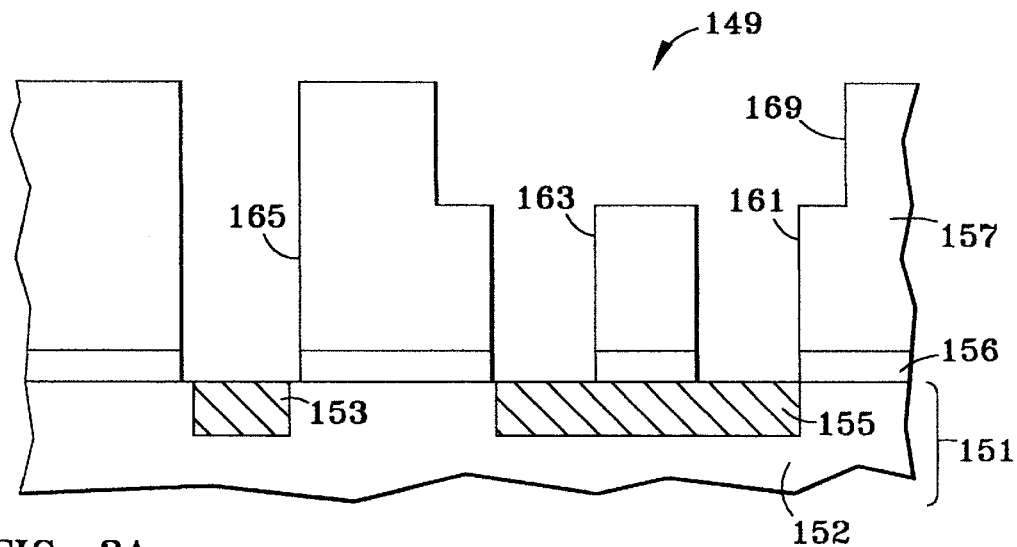
FIGS. 3A–3E are schematic, cross-sectional views of the steps of yet another embodiment of the method of fabricating a capacitor in a semiconductor device.
Figure 3B:
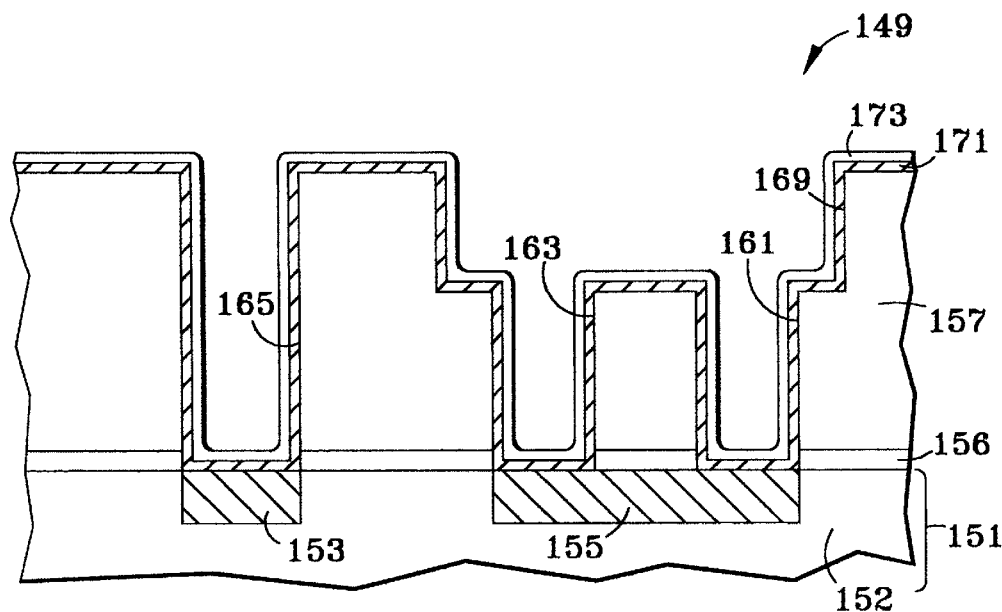

FIG. 3A depicts a portion of a semiconductor chip 149 with device fabrication up through a metal interconnection level 151. Metal interconnect level 151 typically includes an insulating layer 152 in which are formed a series of damascene copper interconnects 153 and 155. As discussed below, interconnect 155 forms the strap contact for the lower plate of the capacitor.

An insulator copper diffusion barrier layer 156 is deposited on level 151 when interconnects 153 and 155 include copper. Layer 156 may be made as the same materials as those used for layer 27 (FIG. 1B), as described above. Layer 156 is optional when interconnects 153 and 155 do not include copper. Insulator layer 157 is deposited on layer 156 for the next metal/via level. Insulator layer 157, may be made from the same materials as insulating layer 29, i.e., $SiO_2$, fluorinated $SiO_2$ (FSG), polyarylene ether (PAE), aerogels, hydrogen silsesquoixane (HSQ), methyl silsesquoixane (MSQ) and $SiO_xC_yH_z$, or other similar materials.

Next, vias 161, 163 and 165, and trench 169 are etched in insulator layers 156 and 157, in the same manner vias 105 and 107, and trenches 101, 102 and 103, are formed in insulating layer 100, as discussed above. More specifically, via 165 is etched down to interconnect 153 and vias 161 and 163 are etched down to interconnect 155, as shown in FIG. 3A. An organic anti-reflective coating (ARC) not shown, which deposits preferentially in vias 161, 163 and 165 may be deposited before formation of trenches 101, 102 and 103. The ARC layer protects vias 161, 163 and 165 from overetching during trench etch. While two vias, i.e., vias 163 and 165 are formed in trench 169, it should be appreciated the present invention encompasses the use of any number of vias, e.g., one, three, 10's, 100's, 1000's or even more vias in the trench.

Then, barrier layer 171 is deposited to a thickness of about 5–40 nm. Barrier layer 171 may be made from the same materials as barrier layer 41, as described above, except that a copper seed layer is typically not included. A layer 173 of a high relative K (i.e. greater than 5) dielectric constant material, e.g., $Si_xN_yH_z$, $SiC_x$, $SiO_x$, is then deposited on barrier layer 171 to a thickness of about 50–300 nm.

Figure 3C:
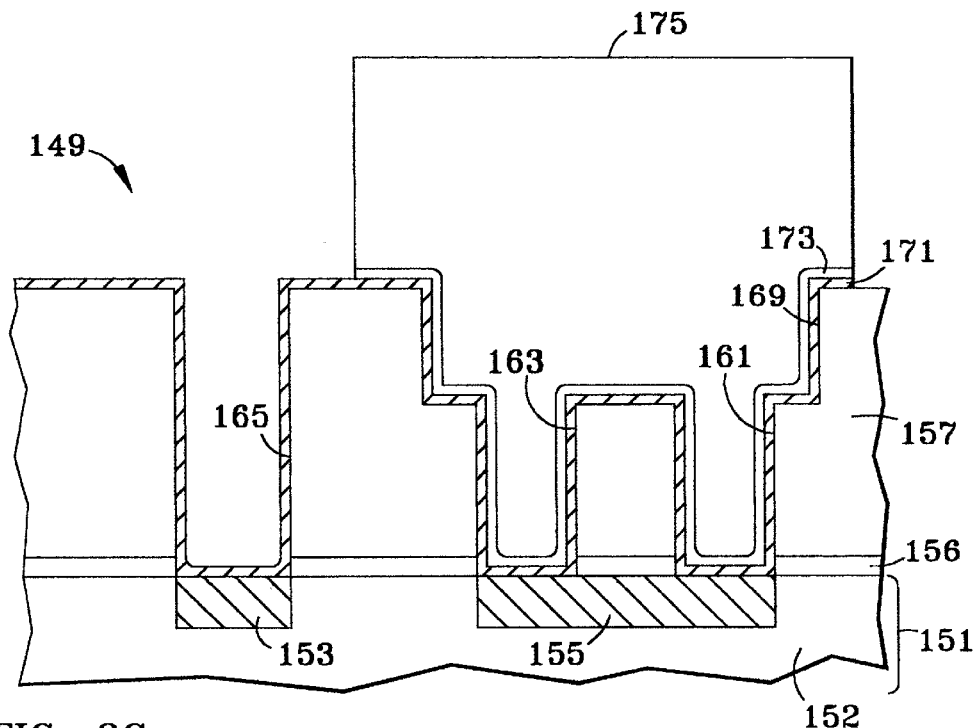

A third photoresist layer 175 is then deposited on dielectric layer 173, photo-patterned and then developed except for the portion over trench 169, and immediately adjacent the trench, as depicted in FIG. 3C. In the next step, dielectric layer 173 is etched away in those areas where photoresist layer 175 has been stripped off, as also depicted in FIG. 3C, using methods previously described.

Figure 3D:
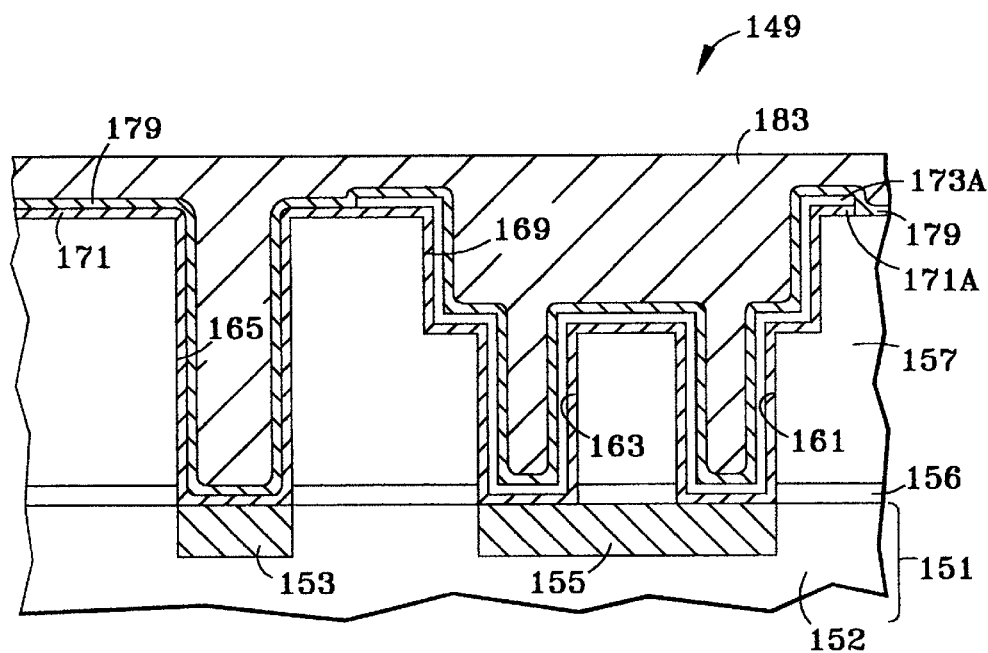

Referring to FIG. 3D, the remaining portions of photoresist layer 175 are stripped off. Then, a barrier layer 179 is deposited on dielectric layer 173, on barrier layer 171 and on other exposed surfaces, and a copper seed layer (not shown) is deposited on barrier layer 179. The materials used for barrier layer 41 may be used for barrier layer 179. A copper layer 183 is then deposited by electroplating. In the final step a CMP process or some other planarization technique is used to remove the excess copper from the wafer, thus leaving copper in via 165, trench 169, via 161 and via 163. Although this invention describes capacitors fabricated with damascene copper, any conductor or semiconductor which can be damascened into wires and vias could be employed.

Figure 3E:
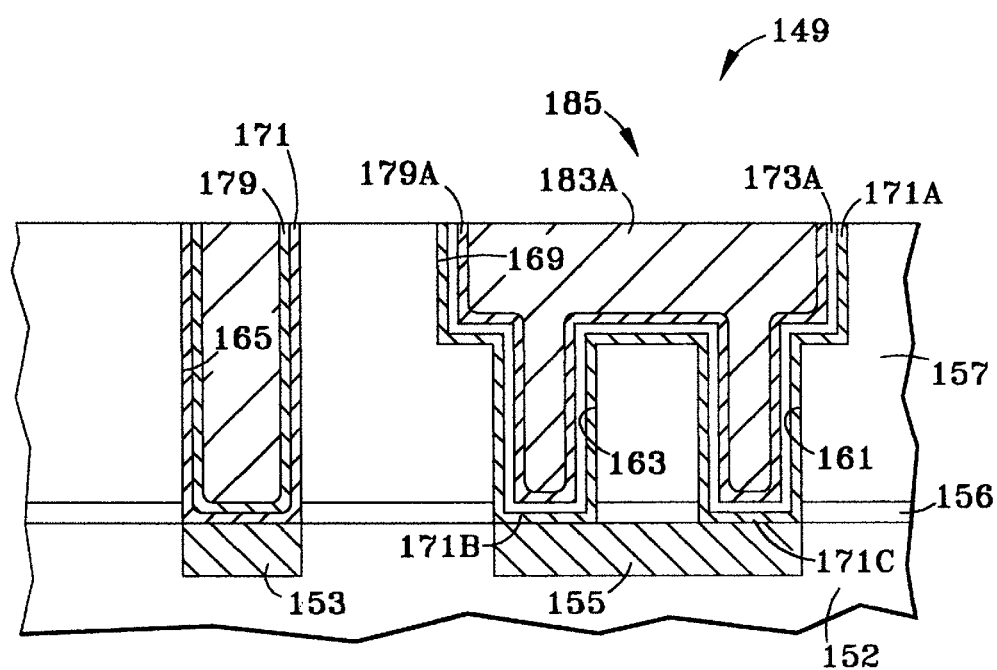
Figure 3E:
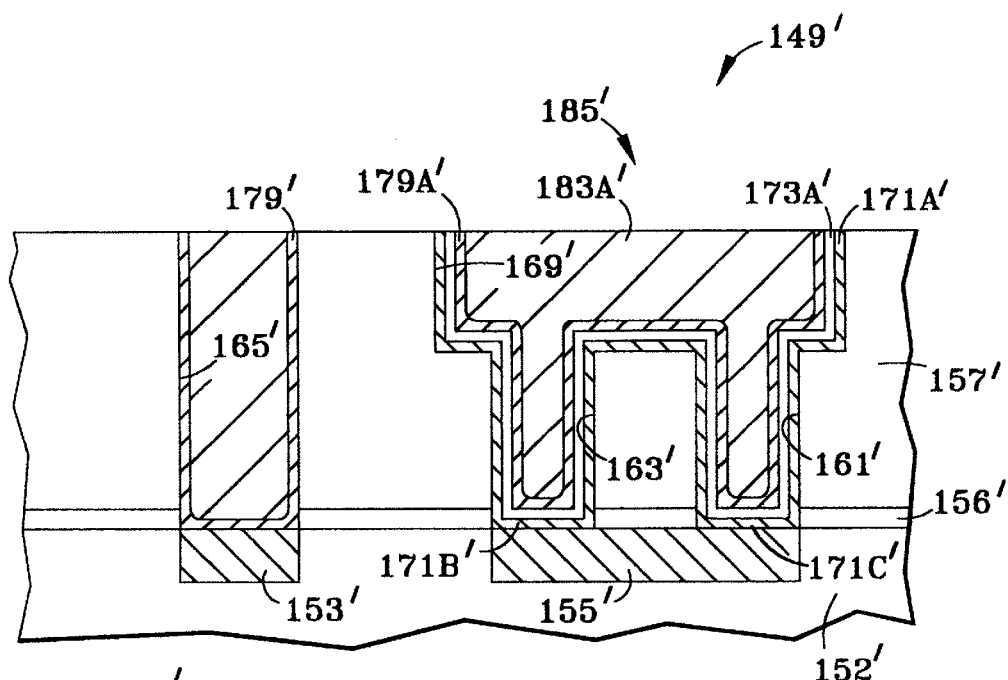

As shown in FIG. 3E, the preceding process steps result in the formation of capacitor 185. Capacitor 185 is made up of lower plate 171A and dielectric layer 173A, with the upper plate comprising the combination of metal barrier layer 179A and copper layer 183A. Interconnect 155 in the preferred embodiment is made of copper and it forms part of the metal interconnect system on metal interconnect level 151. The actual connection of interconnect 155 into the wiring of chip 149, not shown, would depend on the wiring requirements of the device being fabricated. In the preferred embodiment, interconnect 155 is connected to the bottom plate 171A at portions 171B and 171C. The surface of chip 149 shown in FIG. 3E is typically passivated with an insulating layer, such as 50 nm nitride or carbide, to prevent shorting of the bottom and top capacitor plates. If another metalization level is to be added, then another insulator chosen from the materials used for layer 157 is deposited. If the capacitor is built at the last wiring level, an oxide $SiO_2$ or nitride $Si_xN_yH_z$ is generally used. The top plate of capacitor 185 can be contacted by fabricating a wire and via down to surface 183A, as described previously in regard to FIG. 1K.

The aspect ratio of insulation layer 157 in which capacitor 185 is constructed is preferably selected to maximize the capacitance of the capacitor. The aspect ratio of insulation layer 157 is the ratio between the typical width of a via and the depth of the typical via or trench. Preferably this ratio is about 4:1, the width of a typical via being on the order of 0.2 microns and the depth of a typical via or trench being about 0.8 microns. More particularly, by folding of lower plate 171A, dielectric layer 173A, and upper plate layers 179A, and 183A, as illustrated, which occurs as a function of such an aspect ratio, the length of the layers of capacitor 185, and thus its capacitance, is maximized while the "footprint" of the capacitor is minimized. This particularly advantageous where capacitor 185 is intended to be used as a decoupling capacitor in a densely populated region of chip 149.

Barrier layer 171 and high relative K dielectric constant layer 173 could be deposited on the whole wafer (unprotected with photoresist) and then photo-patterned and etched from the areas where capacitors are not present using aqueous or vapor HF acid to etch layer 173 and any Ta or TaN barrier materials, as discussed previously. Other suitable wet or dry etch techniques are available for alternate barriers. As another option the metal barrier could be left in place, depending on the application For example, for a TiN barrier layer 171 and an $SiO_2$ high relative K dielectric constant layer 173, photo-patterning and etching the non-capacitor areas with HF would remove $SiO_2$ layer 173 and leave TiN layer 171. After stripping resist layer 175, barrier layer 179 and Cu film 183 are deposited and planarized as shown in FIGS. 3D and 3E. The resulting structure in non-capacitor trenches and vias would contain both barrier layers 171 and 179.

Referring to FIGS. 3C, 3E and 3E', the present invention encompasses a slight variation of the process described above and illustrated in FIGS. 3A–3E. At the step shown in FIG. 3C, in addition to removing portions of dielectric layer 173 not covered by photoresist 175, the etch process is performed to remove portions of barrier layer 171 not covered by photoresist 175, using processes described above. After removing photoresist 175, barrier layer 179 is then deposited on dielectric layer 173, in via 165 and on other exposed surfaces. As a consequence of this variation, vias and trenches not containing capacitor structures, such as via 165', are lined with barrier layer 179' and then filled with copper 183.

Figure 4A:
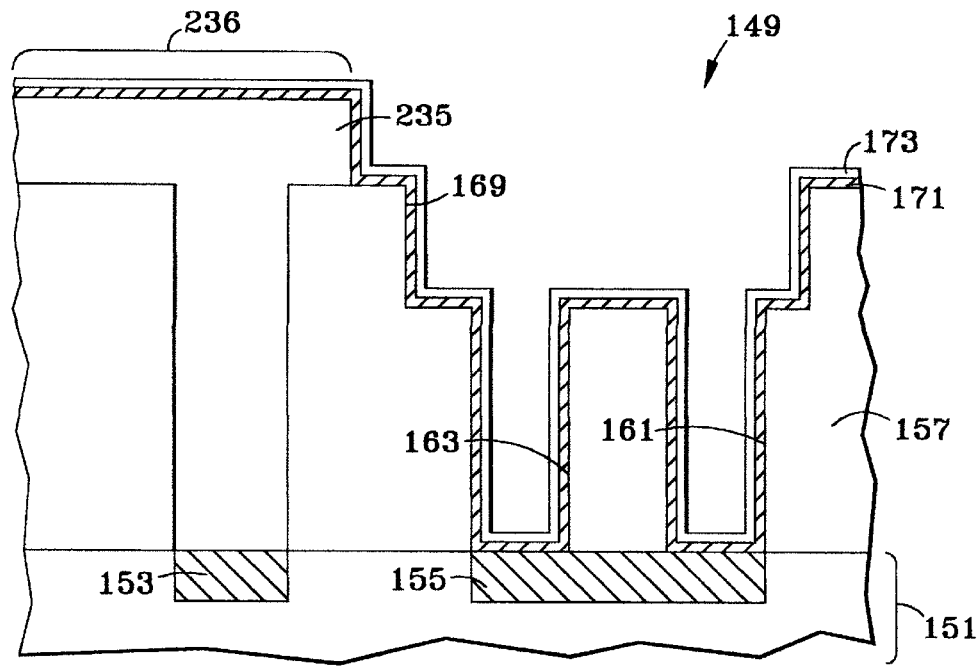
FIGS. 4A and 4B are schematic, cross-sectional view of the steps of a variation of some of the steps of the method illustrated in FIGS. 3A–3E.
Figure 4B:
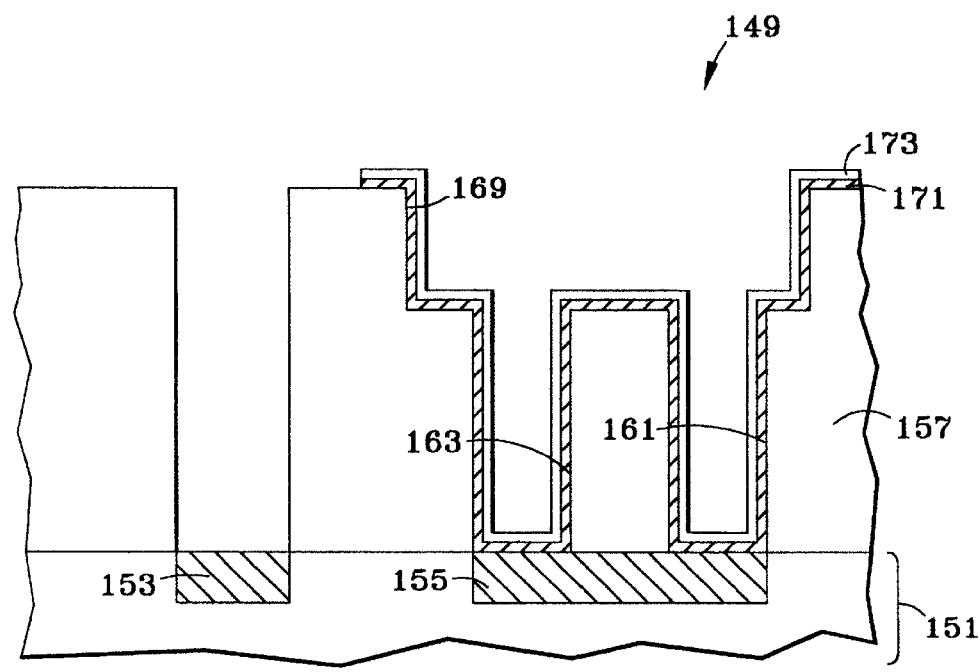

An alternative method of forming capacitor 185 is illustrated in FIGS. 4A and 4B. The initial steps of the alternative method are identical to those described above and illustrated in FIG. 3A, excluding the step of depositing barrier layer 171 and dielectric layer 173.

Referring to FIG. 4A, as the first step in the process, photoresist layer 235 is deposited on insulator layer 157 and is photo-patterned to protect area 236 where capacitor 185 will not be formed. Photoresist layer 235 is preferably a high temperature resist or polymide that can withstand the temperatures required during deposition of layers 171 and 173. In the next step, barrier layer 171 is deposited in vias 161 and 163, in trench 169, on photoresist layer 235 and on adjacent exposed regions of chip 149. High relative K dielectric layer 173 is then deposited over barrier layer 171. Finally, photoresist layer 235 is stripped off. This lift-off process causes portions of layers 171 and 173 covering photoresist layer 235 to be removed, resulting in the structure shown in FIG. 4B.

Thereafter, capacitor 185 is formed in accordance with the process steps described above and illustrated in FIGS. 3D and 3E. Capacitor 185 resulting from the alternative process steps described above and illustrated in FIGS. 4A and 4B is identical to the capacitor resulting from the process steps illustrated in FIGS. 3A–3E and described above.

Here too, while the second version of the invention illustrated in FIGS. 3A–3E and 4A–4B is particularly adapted for use in a copper dual damascene process, it may also be used in other metal dual damascene processes. Again, where a metal other than copper is used, it may be desirable to omit upper barrier layer 179, and use a material for lower barrier layer 171 that does not necessarily block the diffusion of copper.

While the present invention has been described in connection with a preferred embodiment, it will be understood that it is not so limited. On the contrary, it is intended to cover all alternatives, modifications and equivalents as may be included within the spirit and scope of the invention as defined in the appended claims.

What is claimed is:

1. A contact structure for the bottom plate of a capacitor fabricated in a damascene trench in a semiconductor device, the contact structure comprising:
   a. an insulating layer having an opening that extends only partially through said insulating layer, said opening being positioned adjacent, but spaced from, the capacitor;
   b. a first conductive interconnect positioned in said opening such that every portion of said first conductive interconnect is vertically spaced from the damascene trench; and
   c. a strap contact tat extends from the damascene trench and connects the bottom plate to said first conductive interconnect.

2. A contact structure according to claim 1, further including an interconnect level positioned above said insulating layer, wherein said strap contact includes a strap connected to the bottom plate and a second conductive interconnect in said interconnect level that connects said strap to said first conductive interconnect.

3. A contact structure according to claim 1, wherein said strap contact is made of a conductive material selected from the group consisting of a metal or a semiconductor.

4. A contact structure according to claim 1, wherein said strap contact is made of a conductive copper diffusion barrier material.

5. A contact structure according to claim 1, wherein said strap contact is formed as an extension of the bottom plate.

6. A contact structure according to claim 1, wherein said strap contact and the bottom plate are formed from a common conductive barrier layer.

7. A contact structure according to claim 1, further including a first conductive layer contacting said first interconnect and said strap contact, and a stud contacting said first conductive layer.

8. A contact structure according to claim 7, wherein said first conductive layer and said strap contact are formed from a common metal layer.

9. A contact structure according to claim 1, wherein the semiconductor device includes an insulating layer having a surface and a damascene trench in which the bottom plate is formed, further wherein said strap contact extends from the bottom plate to said interconnect across the surface of the insulating layer.

10. A contact structure according to claim 1, further including a protective layer covering said strap contact.

11. A structure according to claim 10, further wherein said dielectric layer covers said strap contact.

12. A contact structure according to claim 1, further including a metal interconnect level positioned below said insulating layer, said level having a third interconnect, wherein said first interconnect contacts said third interconnect.

13. A capacitor structure in a semiconductor device, the structure comprising;
   a. an insulating layer having a first opening and a second opening formed therein, wherein said first opening and said second opening extend only partially through said insulating layer;
   b. a top plate positioned at least partially in said first opening;
   c. a bottom plate positioned at least partially in said first opening;
   d. a dielectric layer positioned between said top plate and said bottom plate;
   e. a first conductive interconnect positioned in said second opening such that every portion of said first conductive interconnect is vertically spaced from said first opening; and
   f. a strap connecting said bottom plate to said first conductive interconnect.

14. A structure according to claim 13, further including an interconnect level positioned above said insulating layer, wherein said strap includes a first portion connected to said bottom plate and a second conductive interconnect in said interconnect level that connects said strap to said first conductive interconnect.

15. A structure according to claim 13, wherein said strap contact includes a copper diffusion barrier film.

16. A structure according to claim 13, wherein said top plate includes copper.

17. A structure according to claim 13, wherein said strap contact is formed as an extension of said bottom plate.

18. A structure according to claim 13, wherein said strap contact and said bottom plate are formed from a common copper diffusion barrier layer.

19. A structure according to claim 13, further including a first conductive layer contacting said first interconnect and said strap contact, and a stud contacting said first conductive layer.

20. A structure according to claim 13, further wherein said insulating layer has a surface and said strap contact extends from said bottom plate to said interconnect across said surface of said insulating layer.

21. A structure according to claim 13, further including a metal interconnect level positioned below said insulating layer, said level having a third interconnect, wherein said first interconnect contacts said third interconnect.

22. A contact structure according to claim 13, further including a metal interconnect level positioned above said insulating layer, said level including a fourth interconnect, wherein said top plate is connected to said fourth interconnect.

* * * * *